United States Patent
Kono et al.

(10) Patent No.: US 12,408,397 B2
(45) Date of Patent: Sep. 2, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroshi Kono, Himeji Hyogo (JP); Katsuhisa Tanaka, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 535 days.

(21) Appl. No.: 17/941,725

(22) Filed: Sep. 9, 2022

(65) Prior Publication Data
US 2023/0307496 A1    Sep. 28, 2023

(30) Foreign Application Priority Data

Mar. 24, 2022    (JP) ................... 2022-049040

(51) Int. Cl.
| | |
|---|---|
| *H10D 62/13* | (2025.01) |
| *H10D 30/66* | (2025.01) |
| *H10D 62/832* | (2025.01) |

(52) U.S. Cl.
CPC ......... *H10D 62/153* (2025.01); *H10D 30/668* (2025.01); *H10D 62/8325* (2025.01)

(58) Field of Classification Search
CPC . H10D 62/153; H10D 62/8325; H10D 30/668
See application file for complete search history.

(56) References Cited

U.S. PATENT DOCUMENTS

| | | | |
|---|---|---|---|
| 7,811,907 B2 | 10/2010 | Shibata et al. | |
| 8,193,564 B2 | 6/2012 | Suzuki et al. | |
| 11,107,911 B2 | 8/2021 | Takeuchi et al. | |
| 2002/0027237 A1 | 3/2002 | Onishi et al. | |
| 2009/0280609 A1 | 11/2009 | Akiba et al. | |
| 2011/0210391 A1 | 9/2011 | Kitagawa | |
| 2020/0235239 A1 | 7/2020 | Noborio et al. | |

FOREIGN PATENT DOCUMENTS

| | | |
|---|---|---|
| JP | 2002076339 A | 3/2002 |
| JP | 2009-194065 A | 8/2009 |
| JP | 2009259896 A | 11/2009 |

(Continued)

*Primary Examiner* — Samuel A Gebremariam
(74) *Attorney, Agent, or Firm* — Kim & Stewart LLP

(57) ABSTRACT

A semiconductor device of an embodiment includes a trench in a silicon carbide layer and extending in a first direction, a gate electrode in the trench, first, second, third and fourth silicon carbide regions disposed in the silicon carbide layer in the first direction in this order, first and third silicon carbide regions having first conductive type, second and fourth silicon carbide regions having second conductive type, fifth, sixth, seventh and eighth silicon carbide regions disposed in the silicon carbide layer in the first direction in this order above the first to fourth silicon carbide regions, fifth and seventh silicon carbide regions having first conductive type higher than first and third silicon carbide regions, sixth and eighth silicon carbide regions having second conductive type higher than second and fourth silicon carbide regions, a ninth silicon carbide region of a first conductive type above the fifth to eighth silicon carbide regions.

10 Claims, 23 Drawing Sheets

(56) References Cited

FOREIGN PATENT DOCUMENTS

| | | | |
|---|---|---|---|
| JP | 2011181583 | A | 9/2011 |
| JP | 4793390 | B2 | 10/2011 |
| JP | 2012-169385 | A | 9/2012 |
| JP | 5566987 | B2 | 8/2014 |
| JP | 2019-16775 | A | 1/2019 |
| JP | 2020-109809 | A | 7/2020 |
| WO | 2012/108165 | A1 | 8/2012 |

SEMICONDUCTOR DEVICE

CROSS-REFERENCE TO RELATED APPLICATION

This application is based upon and claims the benefit of priority from Japanese Patent Application No. 2022-049040, filed on Mar. 24, 2022, the entire contents of which are incorporated herein by reference.

FIELD

Embodiments described herein relate generally to a semiconductor device.

BACKGROUND

Silicon carbide (SiC) is expected as a material for a semiconductor device. Silicon carbide has physical properties such as a band gap, a breakdown field strength, and a thermal conductivity that are about 3 times, about 10 times, and about 3 times better than those of silicon, respectively. By utilizing these characteristics, for example, a metal oxide semiconductor field effect transistor (MOSFET) capable of operating at a high breakdown voltage, a low loss, and a high temperature can be realized.

In a vertical MOSFET, a trench gate structure in which a gate electrode is provided in a trench is applied in order to realize low on-resistance. By applying the trench gate structure, a channel area per unit area is increased, and the on-resistance is reduced.

When a short circuit occurs in a load driven using a MOSFET, a large current flows through the MOSFET, and the MOSFET is broken down. The time until breakdown of the MOSFET occurs is referred to as short circuit resistance. From the viewpoint of improving reliability of the MOSFET, it is desirable to improve the short circuit resistance.

DETAILED DESCRIPTION

Figure 1:
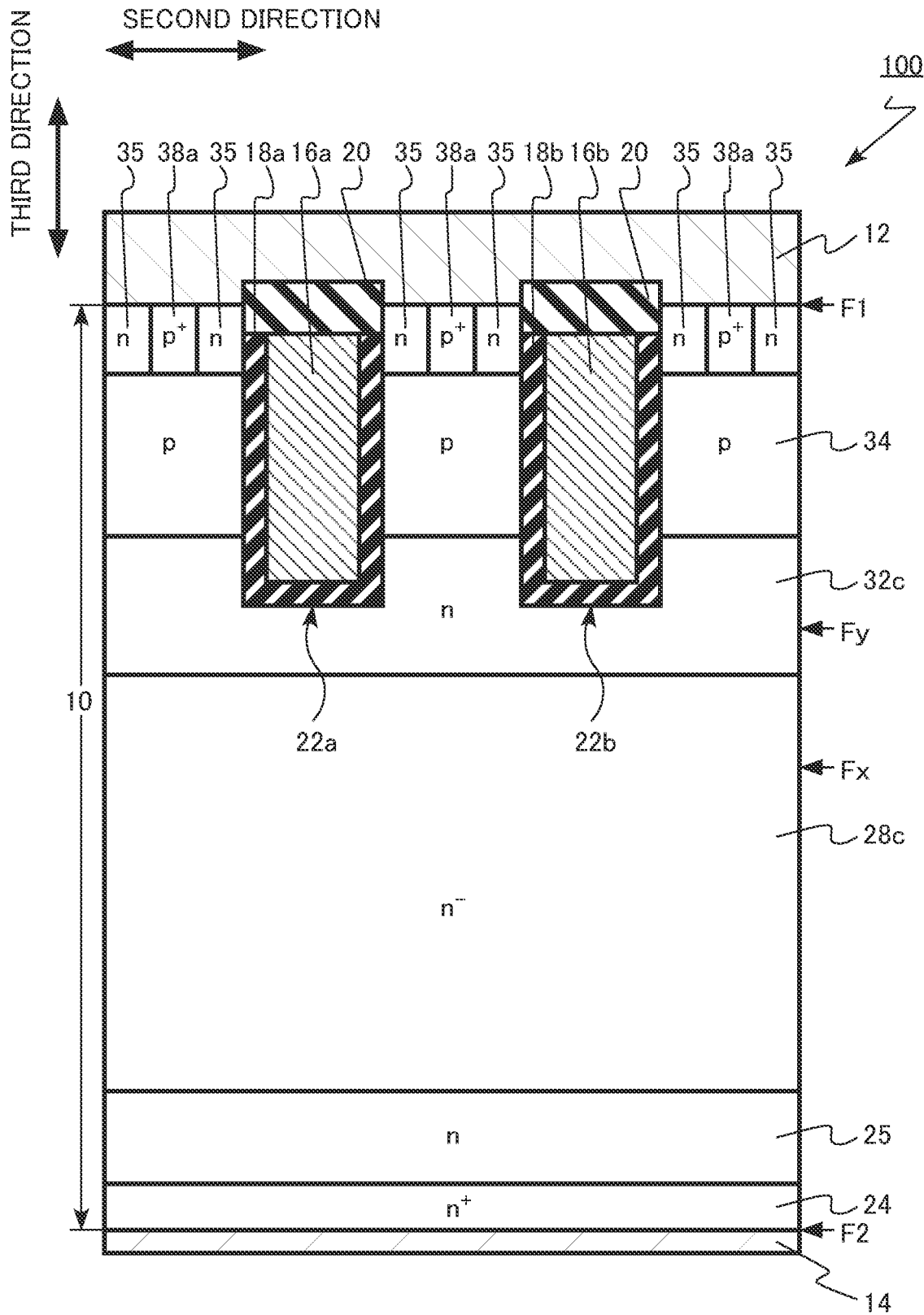
FIG. 1 is a schematic cross-sectional view of a semiconductor device of a first embodiment.

A semiconductor device of an embodiment includes: a silicon carbide layer having a first face parallel to a first direction and a second direction orthogonal to the first direction, and a second face facing the first face; a first trench provided on a side of the first face in the silicon carbide layer and extending in the first direction; a second trench provided on the side of the first face in the silicon carbide layer, provided in the second direction with respect to the first trench, and extending in the first direction; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first silicon carbide region of a first conductive type provided in the silicon carbide layer and extending in the second direction; a second silicon carbide region of a second conductive type provided in the silicon carbide layer, extending in the second direction, and disposed in the first direction with respect to the first silicon carbide region; a third silicon carbide region of a first conductive type provided in the silicon carbide layer, extending in the second direction, and disposed in the first direction with respect to the second silicon carbide region; a fourth silicon carbide region of a second conductive type provided in the silicon carbide layer, extending in the second direction, and disposed in the first direction with respect to the third silicon carbide region; a fifth silicon carbide region of a first conductive type provided in the silicon carbide layer, extending in the second direction, disposed between the first silicon carbide region and the first face, disposed in a third direction perpendicular to the first face with respect to the first silicon carbide region, disposed between the first trench and the second face and between the second trench and the second face, and having a first-conductivity type impurity concentration higher than a first-conductivity type impurity concentration in the first silicon carbide region, and; a sixth silicon carbide region of a second conductive type provided in the silicon carbide layer, extending in the second direction, disposed between the second silicon carbide region and the first face, disposed in the third direction with respect to the second silicon carbide region, disposed between the first trench and the second face and between the second trench and the second face, and having a second-conductivity type impurity concentration higher than a second-conductivity type impurity concentration in the second silicon carbide region; a seventh silicon carbide region of a first conductive type provided in the silicon carbide layer, extending in the second direction, disposed between the third silicon carbide region and the first face, disposed in the third direction with respect to the third silicon carbide region, disposed between the first trench and the second face and between the second trench and the second face, having a first-conductivity type impurity concentration higher than a first-conductivity type impurity concentration in the third silicon carbide region; an eighth silicon carbide region of a second conductive type provided in the silicon carbide layer, extending in the second direction, disposed between the fourth silicon carbide region and the first face, disposed in the third direction with respect to the fourth silicon carbide region, disposed between the first trench and the second face and between the second trench and the second face, and having a second-conductivity type impurity concentration higher than a second-conductivity type impurity concentration in the fourth silicon carbide region; a ninth silicon carbide region of a first conductive type provided in the silicon carbide layer, disposed between the fifth silicon carbide region and the first face, disposed between the sixth silicon carbide region and the first face, disposed between the seventh silicon carbide region and the first face, disposed between the eighth silicon carbide region and the first face, and disposed between the first trench and the second trench; a tenth silicon carbide region of a second conductive type provided in the silicon carbide layer, disposed between the ninth silicon carbide region and the first face, and disposed between the first trench and the second trench; an eleventh silicon carbide region of a first conductive type provided in the silicon carbide layer, disposed between the ninth silicon carbide region and the first face, disposed between the first trench and the second trench, and having a first-conductivity type impurity concentration higher than a first-conductivity type impurity concentration in the ninth silicon carbide region; a first electrode provided on the side of the first face with respect to the silicon carbide layer and in contact with the tenth silicon carbide region and the eleventh silicon carbide region; and a second electrode provided on a side of the second face with respect to the silicon carbide layer.

Hereinafter, embodiments of the present disclosure will be described with reference to the drawings. Note that in the following description, the same or similar members and the like are denoted by the same reference numerals, and the descriptions of the members and the like once described are appropriately omitted.

In addition, in the following description, when there are notations of $n^+$, n, $n^-$, $p^+$, p, and $p^-$, these notations indicate relative levels of impurity concentrations in respective conductive types. That is, $n^+$ indicates an n-type impurity concentration relatively higher than that of n, and $n^-$ indicates an n-type impurity concentration relatively lower than that of n. In addition, $p^+$ indicates a p-type impurity concentration relatively higher than that of p, and $p^-$ indicates a p-type impurity concentration relatively lower than that of p. Note that an $n^+$-type and an $n^-$-type may be simply referred to as an n-type, and a $p^+$-type and a $p^-$-type may be simply referred to as a p-type.

An impurity concentration can be measured by, for example, secondary ion mass spectrometry (SIMS). In addition, a relative level of the impurity concentration can also be determined from a level of a carrier concentration obtained by, for example, scanning capacitance microscopy (SCM). In addition, a distance such as a depth of an impurity region can be obtained by, for example, SIMS. In addition, a distance such as a width or depth of an impurity region can be obtained from, for example, an SCM image.

A shape of a trench, a thickness of an insulating layer, and the like can be measured on, for example, a transmission electron microscope (TEM) image.

Note that in the present specification, a "p-type impurity concentration" in a p-type silicon carbide region means a net p-type impurity concentration obtained by subtracting an n-type impurity concentration in the corresponding region from the p-type impurity concentration in the corresponding region. In addition, an "n-type impurity concentration" in an n-type silicon carbide region means a net n-type impurity concentration obtained by subtracting a p-type impurity concentration in the corresponding region from the n-type impurity concentration in the corresponding region.

In addition, in the present specification, an impurity concentration in a specific region is represented by an impurity concentration at the central portion of the corresponding region, unless otherwise defined.

First Embodiment

A semiconductor device of a first embodiment includes: a silicon carbide layer having a first face parallel to a first direction and a second direction orthogonal to the first direction, and a second face facing the first face; a first trench provided on a side of the first face in the silicon carbide layer and extending in the first direction; a second trench provided on the side of the first face in the silicon carbide layer, provided in the second direction with respect to the first trench, and extending in the first direction; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first silicon carbide region of a first conductive type provided in the silicon carbide layer and extending in the second direction; a second silicon carbide region of a second conductive type provided in the silicon carbide layer, extending in the second direction, and disposed in the first direction with respect to the first silicon carbide region; a third silicon carbide region of a first conductive type provided in the silicon carbide layer, extending in the second direction, and disposed in the first direction with respect to the second silicon carbide region; a fourth silicon carbide region of a second conductive type provided in the silicon carbide layer, extending in the second direction, and disposed in the first direction with respect to the third silicon carbide region; a fifth silicon carbide region of a first conductive type provided in the silicon carbide layer, extending in the second direction, disposed between the first silicon carbide region and the first face, disposed in a third direction perpendicular to the first face with respect to the first silicon carbide region, disposed between the first trench and the second face and between the second trench and the second face, and having a first-conductivity type impurity concentration higher than a first-conductivity type impurity concentration in the first silicon carbide region, and; a sixth silicon carbide region of a second conductive type provided in the silicon carbide layer, extending in the second direction, disposed between the second silicon carbide region and the first face, disposed in the third direction with respect to the second silicon carbide region, disposed between the first trench and the second face and between the second trench and the second face, and having a second-conductivity type impurity concentration higher than a second-conductivity type impurity concentration in the second silicon carbide region; a seventh silicon carbide region of a first conductive type provided in the silicon carbide layer, extending in the second direction, disposed between the third silicon carbide region and the first face, disposed in the third direction with respect to the third silicon carbide region, disposed between the first trench and the second face and between the second trench and the second face, having a first-conductivity type impurity concentration higher than a first-conductivity type impurity concentration in the third silicon carbide region; an eighth silicon carbide region of a second conductive type provided in the silicon carbide layer, extending in the second direction, disposed between the fourth silicon carbide region and the first face, disposed in the third direction with respect to the fourth silicon carbide region, disposed between the first trench and the second face and between the second trench and the second face, and having a second-conductivity type impurity concentration higher than a second-conductivity type impurity concentration in the fourth silicon carbide region; a ninth silicon carbide region of a first conductive type provided in the silicon carbide layer, disposed between the fifth silicon carbide region and the first face, disposed between the sixth silicon carbide region and the first face, disposed between the seventh silicon carbide region and the first face, disposed between the eighth silicon carbide region and the first face, and disposed between the first trench and the second trench; a tenth silicon carbide region of a second conductive type provided in the silicon carbide layer, disposed between the ninth silicon carbide region and the first face, and disposed between the first trench and the second trench; an eleventh silicon carbide region of a first conductive type provided in the silicon carbide layer, disposed between the ninth silicon carbide region and the first face, disposed between the first trench and the second trench, and having a first-conductivity type impurity concentration higher than a first-conductivity type impurity concentration in the ninth silicon carbide region; a first electrode provided on the side of the first face with respect to the silicon carbide layer and in contact with the tenth silicon carbide region and the eleventh silicon carbide region; and a second electrode provided on a side of the second face with respect to the silicon carbide layer.

Hereinafter, a case where a first conductive type is a p-type and a second conductive type is an n-type will be described by way of example.

FIG. 1 is a schematic cross-sectional view of a semiconductor device of a first embodiment. FIG. 1 is a cross section taken along line AA' of FIG. 2.

Figure 2:
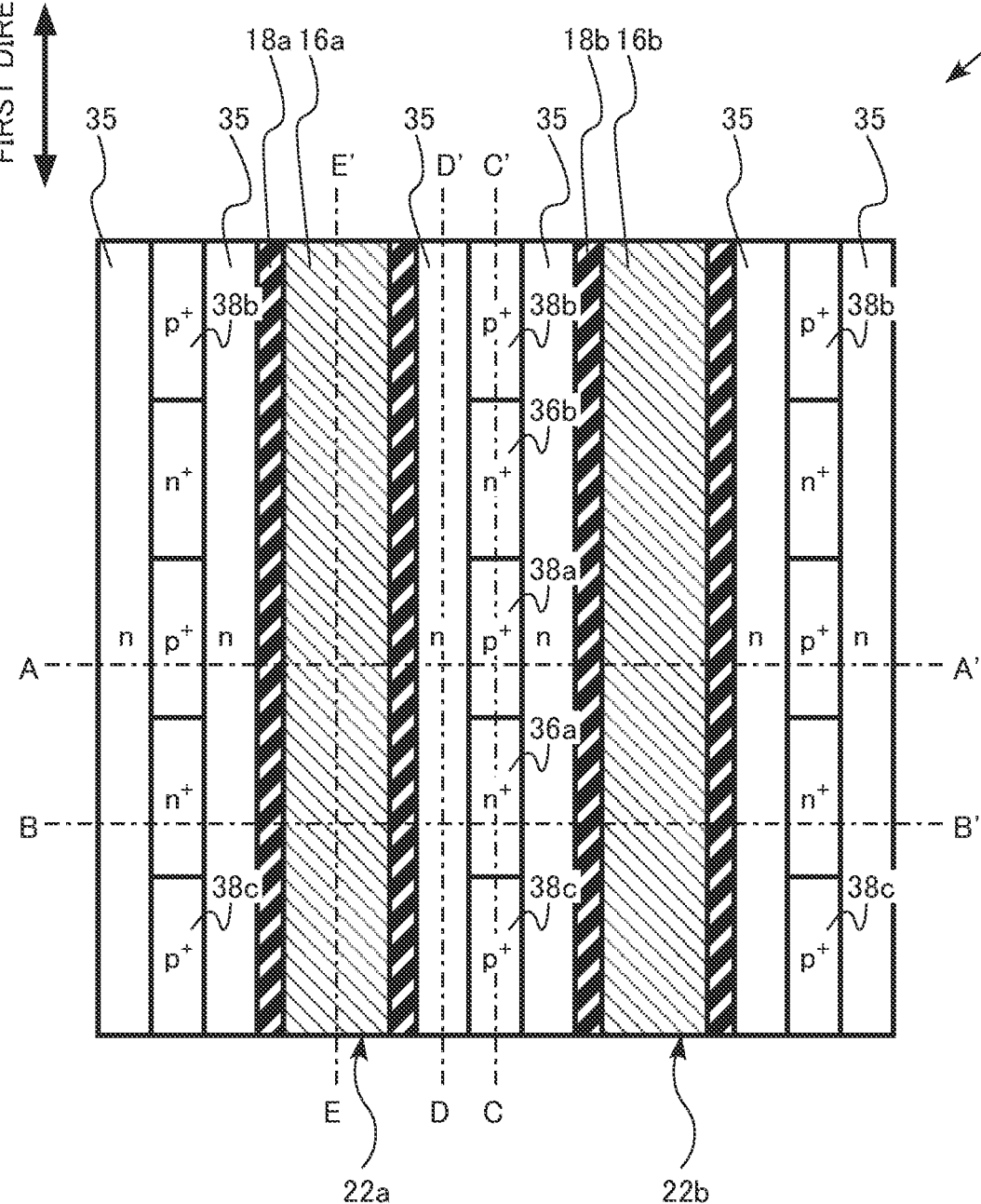
FIG. 2 is a schematic plan view of the semiconductor device of the first embodiment.

FIG. 2 is a schematic plan view of the semiconductor device of the first embodiment. FIG. 2 is a plan view of a first face of FIG. 1 (F1 in FIG. 1).

Figure 3:
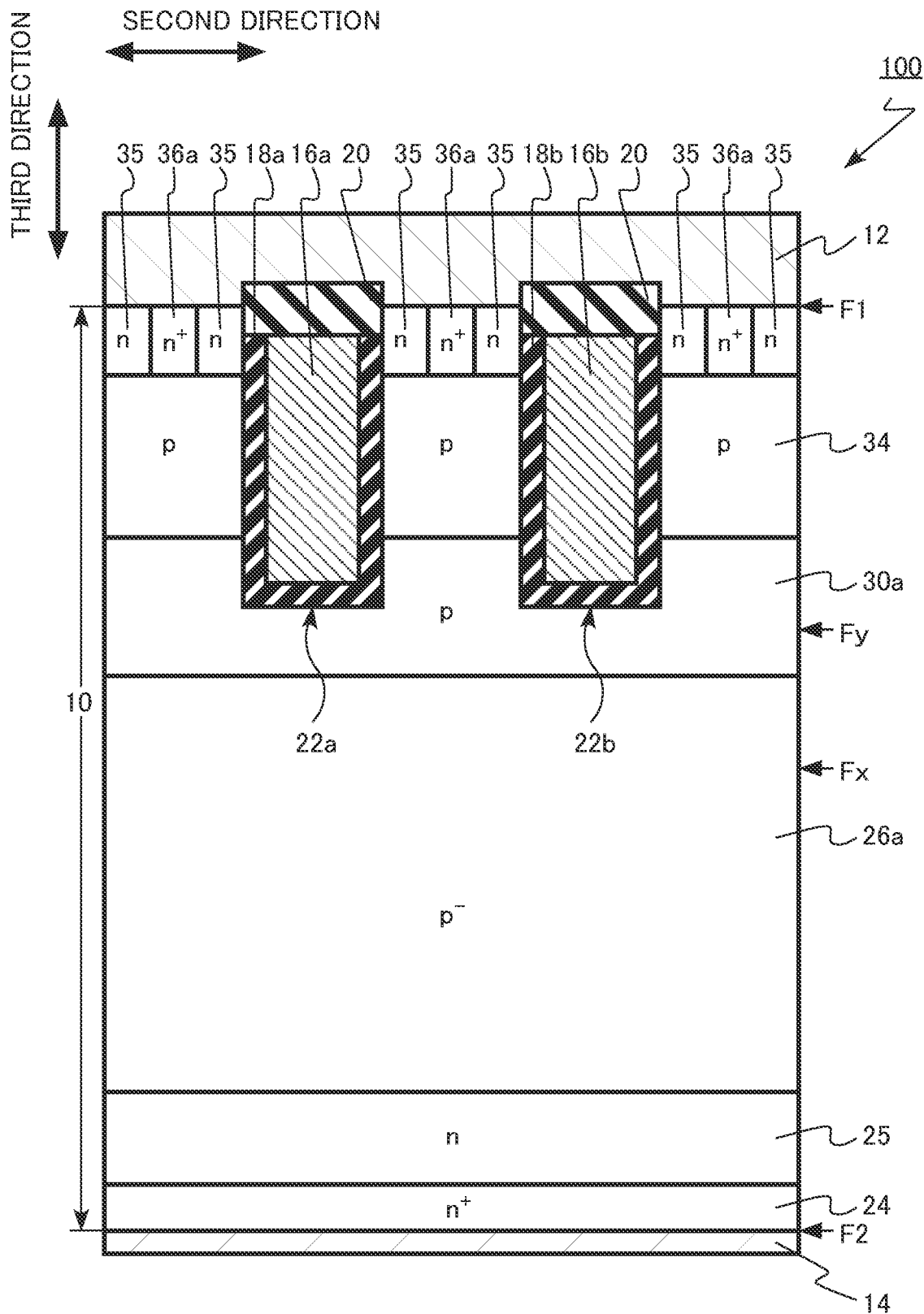
FIG. 3 is a schematic cross-sectional view of the semiconductor device of the first embodiment.

FIG. 3 is a schematic cross-sectional view of the semiconductor device of the first embodiment. FIG. 3 is a cross section taken along line BB' of FIG. 2.

Figure 4:
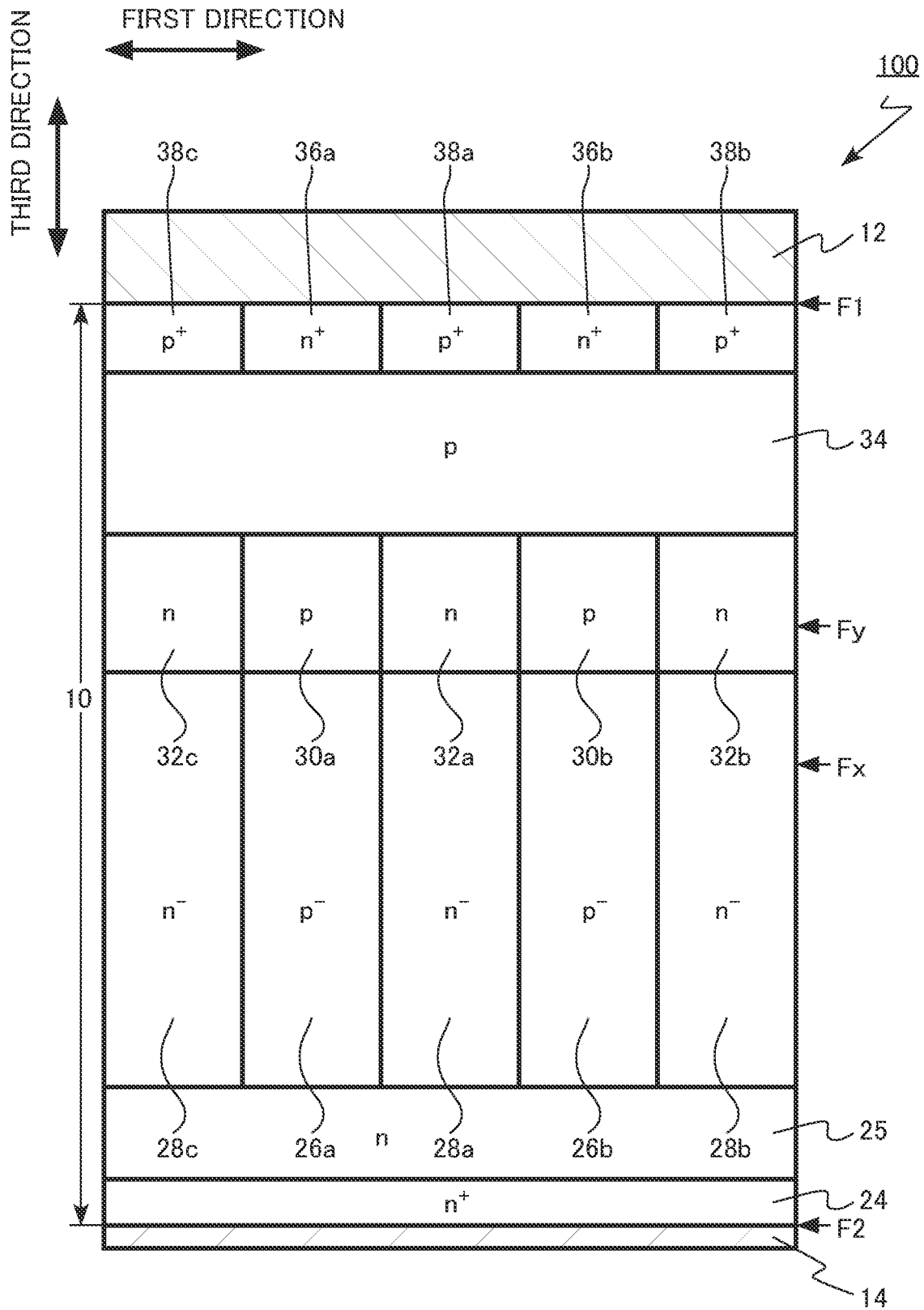
FIG. 4 is a schematic cross-sectional view of the semiconductor device of the first embodiment.

FIG. 4 is a schematic cross-sectional view of the semiconductor device of the first embodiment. FIG. 4 is a cross section taken along line CC' of FIG. 2.

Figure 5:
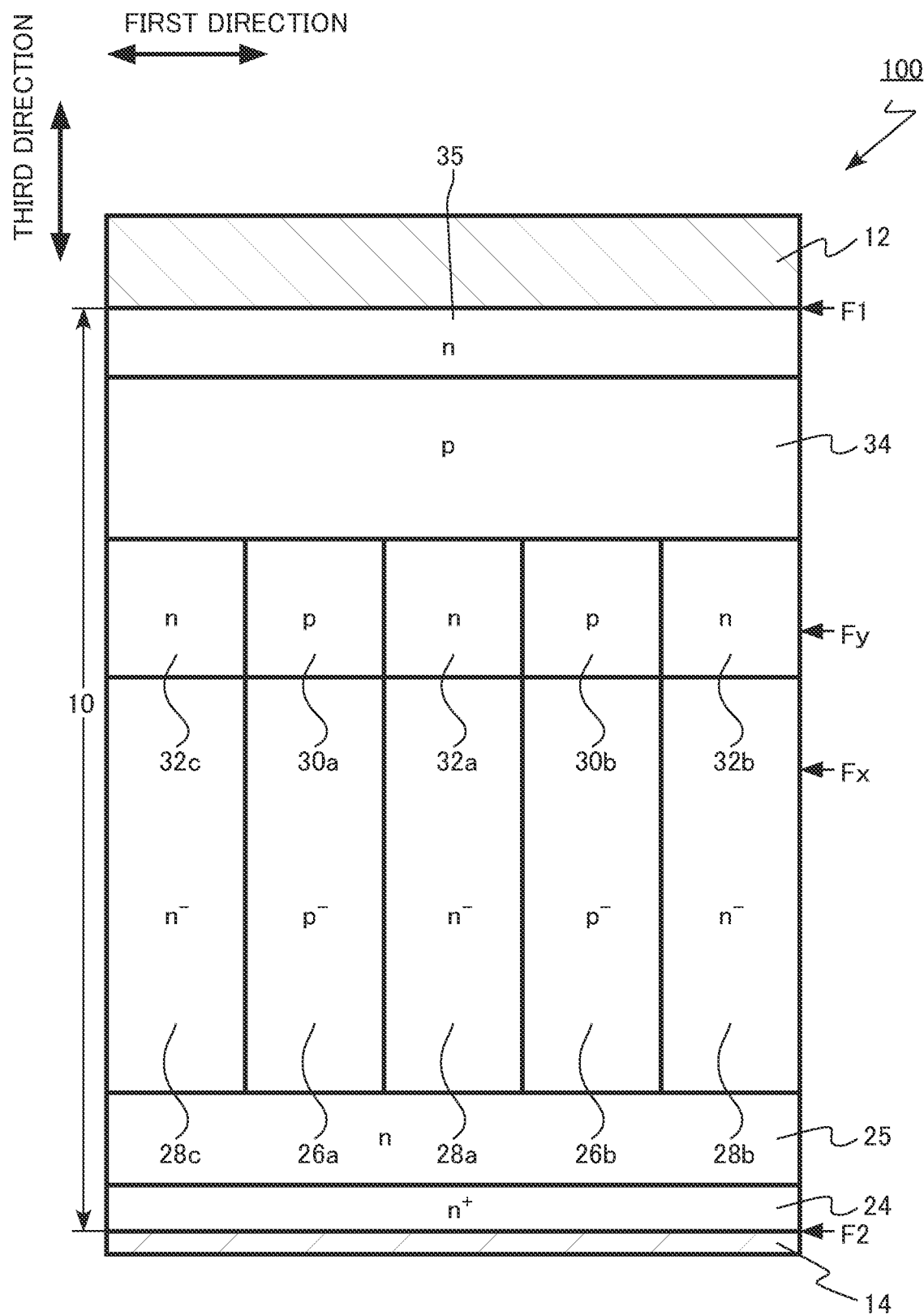
FIG. 5 is a schematic cross-sectional view of the semiconductor device of the first embodiment.

FIG. 5 is a schematic cross-sectional view of the semiconductor device of the first embodiment. FIG. 5 is a cross section taken along line DD' of FIG. 2.

Figure 6:
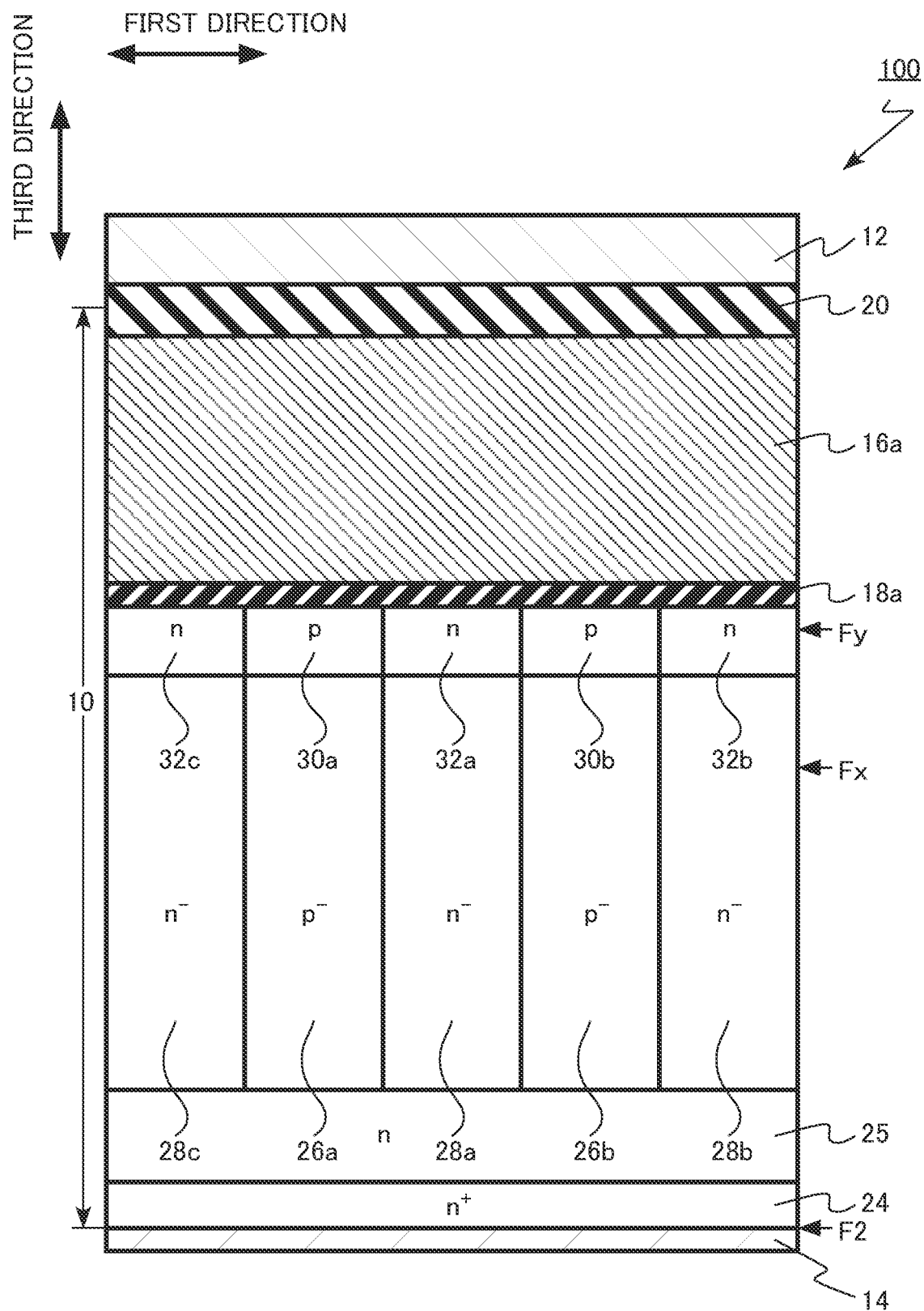
FIG. 6 is a schematic cross-sectional view of the semiconductor device of the first embodiment.

FIG. 6 is a schematic cross-sectional view of the semiconductor device of the first embodiment. FIG. 6 is a cross section taken along line EE' of FIG. 2.

Figure 7:
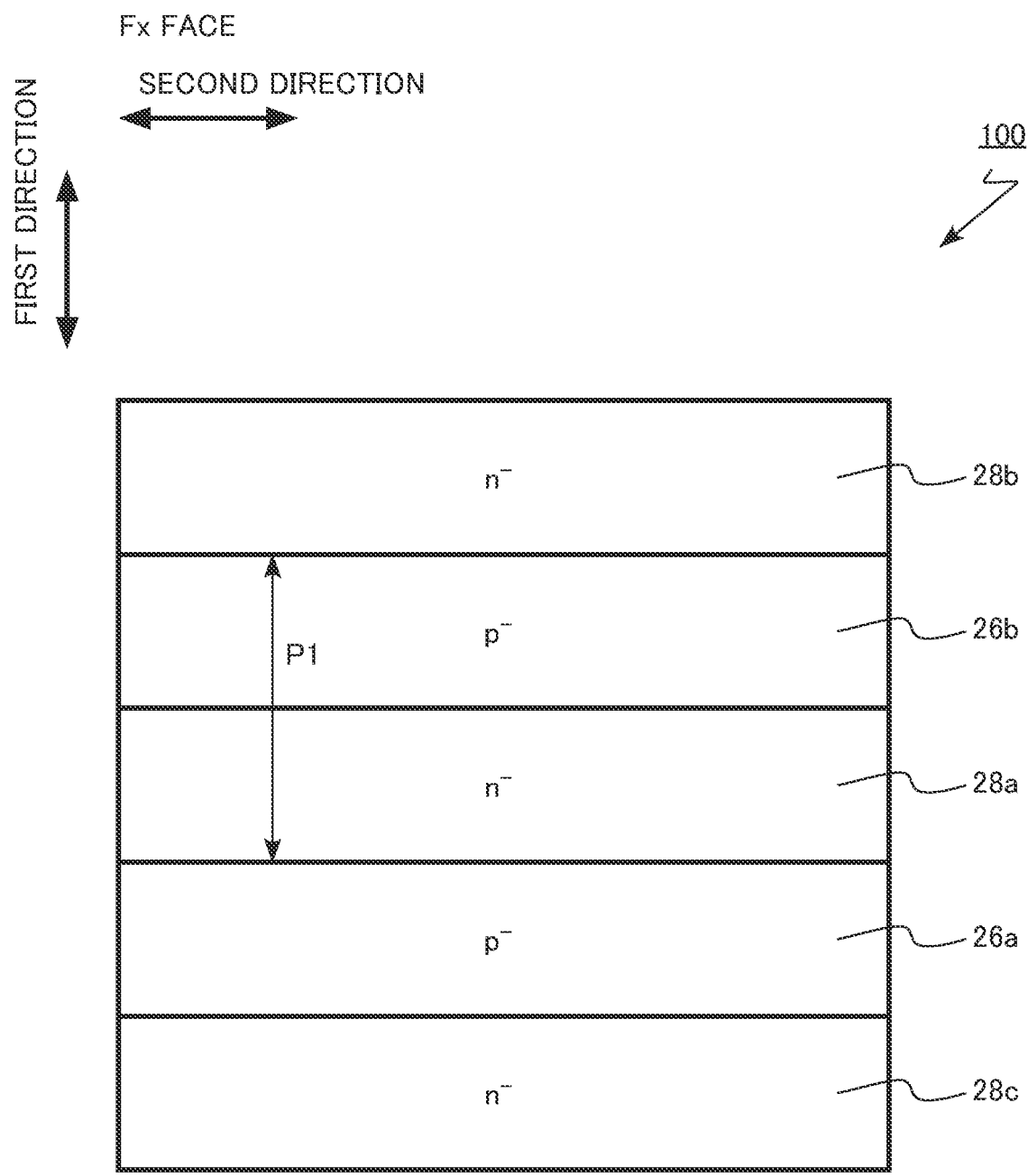
FIG. 7 is a schematic cross-sectional view of the semiconductor device of the first embodiment.

FIG. 7 is a schematic cross-sectional view of the semiconductor device of the first embodiment. FIG. 7 is a cross section of Fx of FIG. 1.

Figure 8:
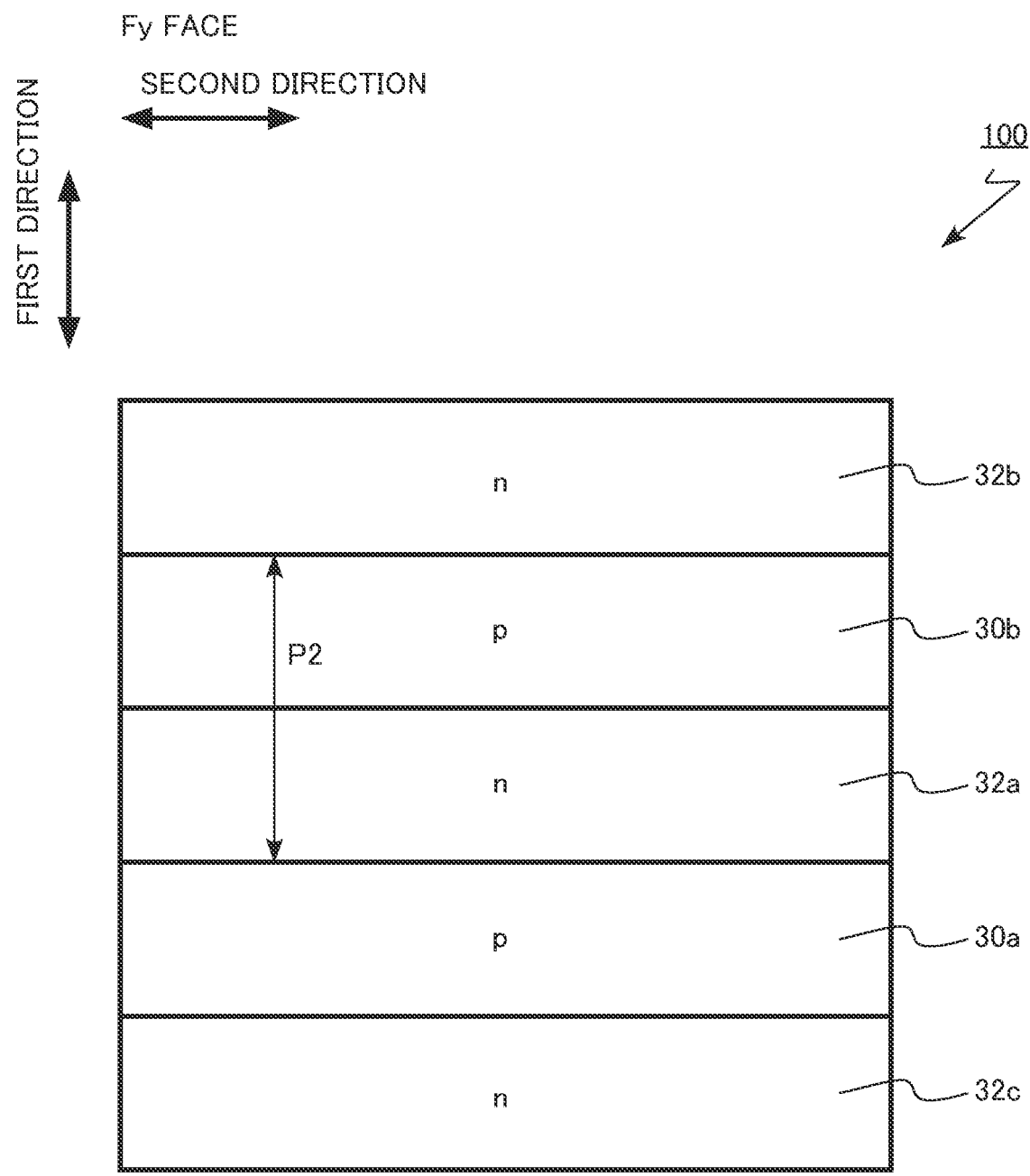
FIG. 8 is a schematic cross-sectional view of the semiconductor device of the first embodiment.

FIG. 8 is a schematic cross-sectional view of the semiconductor device of the first embodiment. FIG. 8 is a cross section of Fy of FIG. 1.

The semiconductor device of the first embodiment is a vertical metal oxide semiconductor field effect transistor (MOSFET) 100 of a trench gate type using silicon carbide. The MOSFET 100 is a MOSFET of an n-channel type using electrons as carriers.

The MOSFET 100 has a super junction structure (hereinafter, also referred to as an "SJ structure"). The SJ structure is a structure in which a p-type semiconductor region and an n-type semiconductor region are alternately arranged. A high breakdown voltage is realized by depleting the p-type semiconductor region and the n-type semiconductor region. At the same time, low on-resistance can be realized by allowing a current to flow through a high impurity concentration region.

The MOSFET 100 includes a silicon carbide layer 10, a source electrode 12 (first electrode), a drain electrode 14 (second electrode), a first gate electrode 16a, a second gate electrode 16b, a first gate insulating layer 18a, a second gate insulating layer 18b, an interlayer insulating layer 20, a first trench 22a, and a second trench 22b.

In the silicon carbide layer 10, an $n^+$-type drain region 24, an n-type buffer region 25, a $p^-$-type first p pillar region 26a (first silicon carbide region), a $p^-$-type second p pillar region 26b (third silicon carbide region), an $n^-$-type first n pillar region 28a (second silicon carbide region), an $n^-$-type second n pillar region 28b (fourth silicon carbide region), an $n^-$-type third n pillar region 28c, a p-type first p control region 30a (fifth silicon carbide region), a p-type second p control region 30b (seventh silicon carbide region), an n-type first n control region 32a (sixth silicon carbide region), an n-type second n control region 32b (eighth silicon carbide region), an n-type third n control region 32c, a p-type body region 34 (ninth silicon carbide region), an n-type source region 35 (fourteenth silicon carbide region), an $n^+$-type first n contact region 36a (tenth silicon carbide region), an $n^+$-type second n contact region 36b (twelfth silicon carbide region), a $p^+$-type first p contact region 38a (eleventh silicon carbide region), a $p^+$-type second p contact region 38b (thirteenth silicon carbide region), and a $p^+$-type third p contact region 38c are provided.

Hereinafter, the first gate electrode 16a and the second gate electrode 16b may be collectively referred to as a gate electrode 16. In addition, the first gate insulating layer 18a and the second gate insulating layer 18b may be collectively referred to as a gate insulating layer 18. In addition, the first trench 22a and the second trench 22b may be collectively referred to as a trench 22.

Hereinafter, the first p pillar region 26a and the second p pillar region 26b may be collectively referred to as a p pillar region 26. In addition, the first n pillar region 28a, the second n pillar region 28b, and the third n pillar region 28c may be collectively referred to as an n pillar region 28. In addition, the first p control region 30a and the second p control region 30b may be collectively referred to as a p control region 30. In addition, the first n control region 32a, the second n control region 32b, and the third n control region 32c may be collectively referred to as an n control region 32. In addition, the first n contact region 36a and the second n contact region 36b may be collectively referred to as an n contact region 36. In addition, the first p contact region 38a, the second p contact region 38b, and the third p contact region 38c may be collectively referred to as a p contact region 38.

The silicon carbide layer 10 is single crystal SiC. The silicon carbide layer 10 is, for example, 4H-SiC.

The silicon carbide layer 10 has a first face ("F1" in FIG. 1) and a second face ("F2" in FIG. 1) facing the first face. Hereinafter, the first face F1 may be referred to as a surface, and the second face F2 may be referred to as a back surface. Note that, hereinafter, a "depth" refers to a depth based on the first face F1.

In FIGS. 1, 2, 3, 4, 5, 6, 7, and 8, a first direction and a second direction are parallel to the first face F1 and the second face F2. The third direction is perpendicular to the first face F1 and the second face F2. The second direction is perpendicular to the first direction.

The first face F1 is, for example, a face inclined at equal to or more than 0° and equal to or less than 8° with respect to a (0001) face. That is, the first face F1 is a face whose normal is inclined at equal to or more than 0° and equal to or less than 8° with respect to a c-axis in a [0001] direction. In other words, an off angle with respect to the (0001) face is equal to or more than 0° and equal to or less than 8°. In addition, the second face F2 is, for example, a face inclined at equal to or more than 0° and equal to or less than 8° with respect to a (000-1) face.

The (0001) face is referred to as a silicon face. The (000-1) face is referred to as a carbon face. An inclination direction of each of the first face F1 and the second face F2 is, for example, a [11-20] direction. The [11-20] direction is an a-axis direction. For example, the second direction illustrated in FIG. 1 is the a-axis direction.

The first trench 22a and the second trench 22b are provided on a side of the first face F1 of the silicon carbide layer 10. The first trench 22a and the second trench 22b extend in the first direction as illustrated in FIG. 2. A plurality of trenches including the first trench 22a and the second trench 22b are repeatedly disposed in the second direction. A repetition pitch of the trenches in the second direction is, for example, equal to or more than 1.0 μm and equal to or less than 5.0 μm. A depth of each of the first trench 22a and the second trench 22b is, for example, equal to or more than 1 μm and equal to or less than 2 μm.

Each of the first trench 22a and the second trench 22b is a concave portion provided in the first face F1 of the silicon carbide layer 10.

The first gate electrode 16a is provided in the first trench 22a. The first gate electrode 16a is provided between the source electrode 12 and the drain electrode 14. The first gate electrode 16a extends in the first direction.

The second gate electrode 16b is provided in the second trench 22b. The second gate electrode 16b is provided between the source electrode 12 and the drain electrode 14. The second gate electrode 16b extends in the first direction.

The gate electrode 16 is a conductive layer. The gate electrode 16 is, for example, polycrystalline silicon containing p-type impurities or n-type impurities.

The first gate insulating layer 18a is provided between the first gate electrode 16a and the silicon carbide layer 10. The first gate insulating layer 18a is provided at least between each region of the source region 35, the body region 34, the p control region 30, and the n control region 32, and the first gate electrode 16a.

The second gate insulating layer 18b is provided between the second gate electrode 16b and the silicon carbide layer 10. The second gate insulating layer 18b is provided at least between each region of the source region 35, the body region 34, the p control region 30, and the n control region 32, and the second gate electrode 16b.

The gate insulating layer 18 contains, for example, silicon oxide, silicon nitride, or aluminum oxide. The gate insulating layer 18 is, for example, a stacked film of a film containing any of the above materials. The gate insulating layer 18 contains, for example, silicon oxide containing nitrogen.

The interlayer insulating layer 20 is provided on the first gate electrode 16a and the second gate electrode 16b. The interlayer insulating layer 20 is provided between the first gate electrode 16a and the second gate electrode 16b, and the source electrode 12. The interlayer insulating layer 20 contains, for example, silicon oxide.

The $n^+$-type drain region 24 is provided on the back surface of the silicon carbide layer 10. The drain region 24 contains, for example, nitrogen (N) as n-type impurities. An n-type impurity concentration in the drain region 24 is, for example, equal to or more than $5\times10^{19}$ cm$^{-3}$ and equal to or less than $1\times10^{21}$ cm$^{-3}$.

The n-type buffer region 25 is provided on the drain region 24. The buffer region 25 is provided between the drain region 24 and the surface of the silicon carbide layer 10.

The buffer region 25 contains, for example, nitrogen (N) as n-type impurities. An n-type impurity concentration in the buffer region 25 is higher than the n-type impurity concentration in the drain region 24. The n-type impurity concentration in the buffer region 25 is, for example, equal to or more than $5\times10^{17}$ cm$^{-3}$ and equal to or less than $5\times10^{19}$ cm$^{-3}$.

The $p^-$-type first p pillar region 26a is provided between the buffer region 25 and the surface of the silicon carbide layer 10. As illustrated in FIG. 7, the first p pillar region 26a extends in the second direction.

The $n^-$-type first n pillar region 28a is provided between the buffer region 25 and the surface of the silicon carbide layer 10. As illustrated in FIG. 7, the first n pillar region 28a extends in the second direction. In addition, the first n pillar region 28a is disposed in the first direction with respect to the first p pillar region 26a. The first n pillar region 28a is in contact with the first p pillar region 26a.

The $p^-$-type second p pillar region 26b is provided between the buffer region 25 and the surface of the silicon carbide layer 10. As illustrated in FIG. 7, the second p pillar region 26b extends in the second direction. The second p pillar region 26b is disposed in the first direction with respect to the first n pillar region 28a. The second p pillar region 26b is in contact with the first n pillar region 28a.

The $n^-$-type second n pillar region 28b is provided between the buffer region 25 and the surface of the silicon carbide layer 10. As illustrated in FIG. 7, the second n pillar region 28b extends in the second direction. In addition, the second n pillar region 28b is disposed in the first direction with respect to the second p pillar region 26b. The second n pillar region 28b is in contact with the second p pillar region 26b.

The $n^-$-type third n pillar region 28c is provided between the buffer region 25 and the surface of the silicon carbide layer 10. As illustrated in FIG. 7, the third n pillar region 28c extends in the second direction. In addition, the third n pillar region 28c is disposed in the first direction with respect to the first p pillar region 26a. The third n pillar region 28c is in contact with the first p pillar region 26a. The first p pillar region 26a is disposed between the third n pillar region 28c and the first n pillar region 28a.

The p pillar region 26 contains, for example, aluminum (Al) as p-type impurities. A p-type impurity concentration in the p pillar region 26 is, for example, equal to or more than $5 \times 10^{15}$ cm$^{-3}$ and equal to or less than $5 \times 10^{17}$ cm$^{-3}$.

The n pillar region 28 contains, for example, nitrogen (N) as n-type impurities. An n-type impurity concentration in the n pillar region 28 is lower than the n-type impurity concentration in the buffer region 25. The n-type impurity concentration in the n pillar region 28 is for example, equal to or more than $5 \times 10^{15}$ cm$^{-3}$ and equal to or less than $5 \times 10^{17}$ cm$^{-3}$.

A plurality of p pillar regions 26 and a plurality of n pillar regions 28 are alternately disposed in the first direction. The p pillar regions 26 and the n pillar regions 28 form an SJ structure. The SJ structure has a function of improving a breakdown voltage of the MOSFET 100.

A repetition pitch (P1 in FIG. 7) of the p pillar region 26 and the n pillar region 28 in the first direction is, for example, equal to or more than 1.0 µm and equal to or less than 5.0 µm.

The p-type first p control region 30a is disposed between the first p pillar region 26a and the surface of the silicon carbide layer 10. The first p control region 30a is disposed in the third direction with respect to the first p pillar region 26a.

As illustrated in FIG. 8, the first p control region 30a extends in the second direction. The first p control region 30a is disposed between the trench 22 and the back surface of the silicon carbide layer 10. The first p control region 30a is in contact with, for example, a bottom face of the first trench 22a and a bottom face of the second trench 22b.

The n-type first n control region 32a is disposed between the first n pillar region 28a and the surface of the silicon carbide layer 10. The first n control region 32a is disposed in the third direction with respect to the first n pillar region 28a.

As illustrated in FIG. 8, the first n control region 32a extends in the second direction. In addition, the first n control region 32a is disposed in the first direction with respect to the first p control region 30a. The first n control region 32a is in contact with the first p control region 30a.

The first n control region 32a is disposed between the trench 22 and the back surface of the silicon carbide layer 10. The first n control region 32a is in contact with the bottom face of the first trench 22a and the bottom face of the second trench 22b.

The p-type second p control region 30b is disposed between the second p pillar region 26b and the surface of the silicon carbide layer 10. The second p control region 30b is disposed in the third direction with respect to the second p pillar region 26b.

As illustrated in FIG. 8, the second p control region 30b extends in the second direction. The second p control region 30b is disposed in the first direction with respect to the first n control region 32a. The second p control region 30b is in contact with the first n control region 32a.

The second p control region 30b is disposed between the trench 22 and the back surface of the silicon carbide layer 10. The second p control region 30b is in contact with, for example, the bottom face of the first trench 22a and the bottom face of the second trench 22b.

The n-type second n control region 32b is disposed between the second n pillar region 28b and the surface of the silicon carbide layer 10. The second n control region 32b is disposed in the third direction with respect to the second n pillar region 28b.

As illustrated in FIG. 8, the second n control region 32b extends in the second direction. In addition, the second n control region 32b is disposed in the first direction with respect to the second p control region 30b. The second n control region 32b is in contact with the second p control region 30b.

The second n control region 32b is disposed between the trench 22 and the back surface of the silicon carbide layer 10. The second n control region 32b is in contact with the bottom face of the first trench 22a and the bottom face of the second trench 22b.

The n-type third n control region 32c is disposed between the third n pillar region 28c and the surface of the silicon carbide layer 10. The third n control region 32c is disposed in the third direction with respect to the third n pillar region 28c.

As illustrated in FIG. 8, the third n control region 32c extends in the second direction. In addition, the third n control region 32c is disposed in the first direction with respect to the first p control region 30a. The third n control region 32c is in contact with the first p control region 30a.

The third n control region 32c is disposed between the trench 22 and the back surface of the silicon carbide layer 10. The third n control region 32c is in contact with the bottom face of the first trench 22a and the bottom face of the second trench 22b.

The p control region 30 contains, for example, aluminum (Al) as p-type impurities. A p-type impurity concentration in the p control region 30 is higher than the p-type impurity concentration in the p pillar region 26. The p-type impurity concentration in the p control region 30 is, for example, equal to or more than $5 \times 10^{16}$ cm$^{-3}$ and equal to or less than $5 \times 10^{18}$ cm$^{-3}$.

The n control region 32 contains, for example, nitrogen (N) as n-type impurities. An n-type impurity concentration in the n control region 32 is higher than the n-type impurity concentration in the n pillar region 28. The n-type impurity concentration in the n control region 32 is for example, equal to or more than $5 \times 10^{16}$ cm$^{-3}$ and equal to or less than $1 \times 10^{18}$ cm$^{-3}$.

A plurality of p control regions 30 and a plurality of n control regions 32 are alternately disposed in the first direction. The p control regions 30 and the n control regions 32 have a function of improving the short circuit resistance of the MOSFET 100.

The p control regions 30 face the bottom face of the trench 22. The p control region 30 has a function of improving reliability of the gate insulating layer 18.

A repetition pitch (P2 in FIG. 8) of the p control region 30 and the n control region 32 in the first direction is equal to the repetition pitch (P1 in FIG. 7) of the p pillar region 26 and the n pillar region 28 in the first direction. The repetition pitch of the p control region 30 and the n control region 32 in the first direction is, for example, equal to or more than 1.0 µm and equal to or less than 5.0 µm.

The p-type body region 34 is disposed between the p control region 30 and the surface of the silicon carbide layer 10. The p-type body region 34 is disposed between the n control region 32 and the surface of the silicon carbide layer 10. The body region 34 is disposed between the first trench 22a and the second trench 22b. The body region 34 extends in the first direction.

The body region 34 contains, for example, aluminum (Al) as p-type impurities. A p-type impurity concentration in the body region 34 is, for example, equal to or more than $5 \times 10^{16}$ cm$^{-3}$ and equal to or less than $5 \times 10^{18}$ cm$^{-3}$.

A depth of the body region 34 is shallower than the depth of the trench 22. The depth of the body region 34 is, for example, equal to or more than 0.5 µm and equal to or less than 1.0 µm.

The body region 34 functions as a channel region of the MOSFET 100. For example, when the MOSFET 100 is turned on, a channel through which electrons flow is formed in a region of the body region 34 in contact with the gate insulating layer 18. The region of the body region 34 in contact with the gate insulating layer 18 is a channel formation region.

The n-type source region 35 is provided between the body region 34 and the surface of the silicon carbide layer 10. As illustrated in FIG. 2, the source region 35 extends in the first direction.

The source region 35 is provided along the first trench 22a. The source region 35 is provided along the second trench 22b.

The source region 35 is provided along the first gate insulating layer 18a. The source region 35 is provided along the second gate insulating layer 18b. The source region 35 is in contact with the gate insulating layer 18.

The source region 35 is disposed between the trench 22 and the n contact region 36. The source region 35 is disposed between the trench 22 and the p contact region 38.

The n contact region 36 is interposed between the two source regions 35. In addition, the p contact region 38 is interposed between the two source regions 35.

The source region 35 contains, for example, nitrogen (N) as n-type impurities. An n-type impurity concentration in the source region 35 is lower than the n-type impurity concentration in the n contact region 36. The n-type impurity concentration in the source region 35 is, for example, equal to or more than $1 \times 10^{19}$ cm$^{-3}$ and equal to or less than $5 \times 10^{19}$ cm$^{-3}$.

The n$^+$-type first n contact region 36a is disposed between the body region 34 and the surface of the silicon carbide layer 10. The first n contact region 36a is disposed between the first trench 22a and the second trench 22b.

As illustrated in FIG. 4, the first n contact region 36a is disposed in the third direction with respect to the first p control region 30a. The first n contact region 36a is disposed directly above the first p control region 30a.

The p$^+$-type first p contact region 38a is disposed between the body region 34 and the surface of the silicon carbide layer 10. The first p contact region 38a is disposed between the first trench 22a and the second trench 22b. As illustrated in FIG. 2, the first p contact region 38a is disposed in the first direction with respect to the first n contact region 36a.

As illustrated in FIG. 4, the first p contact region 38a is disposed in the third direction with respect to the first n control region 32a. The first p contact region 38a is disposed directly above the first n control region 32a.

The n$^+$-type second n contact region 36b is disposed between the body region 34 and the surface of the silicon carbide layer 10. The second n contact region 36b is disposed between the first trench 22a and the second trench 22b. As illustrated in FIG. 2, the second n contact region 36b is disposed in the first direction with respect to the first p contact region 38a.

As illustrated in FIG. 4, the second n contact region 36b is disposed in the third direction with respect to the second p control region 30b. The second n contact region 36b is disposed directly above the second p control region 30b.

The p$^+$-type second p contact region 38b is disposed between the body region 34 and the surface of the silicon carbide layer 10. The second p contact region 38b is disposed between the first trench 22a and the second trench 22b. As illustrated in FIG. 2, the second p contact region 38b is disposed in the first direction with respect to the second n contact region 36b.

As illustrated in FIG. 4, the second p contact region 38b is disposed in the third direction with respect to the second n control region 32b. The second p contact region 38b is disposed directly above the second n control region 32b.

The p$^+$-type third p contact region 38c is disposed between the body region 34 and the surface of the silicon carbide layer 10. As illustrated in FIG. 2, the third p contact region 38c is disposed in the first direction with respect to the first n contact region 36a.

As illustrated in FIG. 4, the third p contact region 38c is disposed in the third direction with respect to the third n control region 32c. The third p contact region 38c is disposed directly above the third n control region 32c.

The n contact region 36 contains, for example, phosphorous (P) as n-type impurities. An n-type impurity concentration in the n contact region 36 is higher than the n-type impurity concentration in the source region 35. The n-type impurity concentration in the n contact region 36 is for example, equal to or more than $1 \times 10^{19}$ cm$^{-3}$ and equal to or less than $1 \times 10^{21}$ cm$^{-3}$.

The p contact region 38 contains, for example, aluminum (Al) as p-type impurities. A p-type impurity concentration in the p contact region 38 is higher than the p-type impurity concentration in the body region 34. The p-type impurity concentration in the p contact region 38 is for example, equal to or more than $1 \times 10^{19}$ cm$^{-3}$ and equal to or less than $1 \times 10^{21}$ cm$^{-3}$.

A plurality of n contact regions 36 and a plurality of p contact regions 38 are alternately disposed in the first direction. The n contact regions 36 and the p contact regions 38 have a function of reducing the contact resistance of the MOSFET 100 and reducing the on-resistance of the MOSFET 100.

A repetition pitch of the n contact region 36 and the p contact region 38 in the first direction is, for example, equal to the repetition pitch of the p control region 30 and the n control region 32 in the first direction.

The n contact region 36 is disposed in the third direction of the p control region 30. The n contact region 36 is provided directly above the p control region 30.

The p contact region 38 is disposed in the third direction of the n control region 32. The p contact region 38 is provided directly above the n control region 32.

An area of the n contact region 36 provided in the third direction of the p control region 30 on the first face F1 is, for example, larger than an area of the p contact region 38 provided in the third direction of the p control region 30 on the first face F1.

An area of the p contact region 38 provided in the third direction of the n control region 32 on the first face F1 is, for example, larger than an area of the n contact region 36 provided in the third direction of the n control region 32 on the first face F1.

The source electrode 12 is provided on a side of the surface of the silicon carbide layer 10. The source electrode 12 is provided on the surface of the silicon carbide layer 10. The source electrode 12 is in contact with, for example, the n contact region 36 and the p contact region 38.

The source electrode 12 contains a metal. The metal forming the source electrode 12 has, for example, a stacked structure of titanium (Ti) and aluminum (Al). The source electrode 12 may contain, for example, a metal silicide for reducing contact resistance in a portion in contact with the n contact region 36 and the p contact region 38. The metal silicide is, for example, nickel silicide.

The contact between the source electrode 12 and each of the n contact region 36 and the p contact region 38 is, for example, an ohmic contact.

The drain electrode 14 is provided on a side of the back surface of the silicon carbide layer 10. The drain electrode 14 is provided on the back surface of the silicon carbide layer 10. The drain electrode 14 is in contact with the drain region 24.

The drain electrode 14 is, for example, a metal or a metal semiconductor compound. The drain electrode 14 contains, for example, a material selected from the group consisting of nickel silicide (NiSi), titanium (Ti), nickel (Ni), silver (Ag), and gold (Au).

Next, a function and effect of the semiconductor device of the first embodiment will be described.

A trench gate structure in which the gate electrode 16 is provided in the trench 22 is applied to the MOSFET 100. By applying the trench gate structure, a channel area per unit area is increased, and the on-resistance of the MOSFET 100 is reduced.

In addition, the MOSFET 100 has the SJ structure. When the MOSFET 100 is turned off, a depletion layer spreads in the first direction in the SJ structure. Therefore, the breakdown voltage of the MOSFET 100 is improved.

When a short circuit occurs in a load driven using a MOSFET, a large current flows through the MOSFET, and the MOSFET is broken down. The time until breakdown of the MOSFET occurs is referred to as short circuit resistance. From the viewpoint of improving reliability of the MOSFET, it is desirable to improve the short circuit resistance.

The MOSFET 100 has the n control region 32 having an n-type impurity concentration higher than that in the n pillar region 28, the n control region 32 being provided on the n pillar region 28 serving as a current path when the MOSFET 100 is turned on. That is, the MOSFET 100 has the n control region 32 having a higher n-type impurity concentration and a lower electrical resistance than in the n pillar region 28.

In a case where a short circuit occurs in a load and a large current flows through the MOSFET 100, heat generation in the vicinity of an interface between the n control region 32 and the n pillar region 28 is increased. This is because the electrical resistance is increased in the vicinity of the interface between the n control region 32 and the n pillar region 28.

On the contrary, in a case where the n control region 32 does not exist, when a short circuit occurs in a load and a large current flows through the MOSFET 100, heat generation in the vicinity of an interface between the body region 34 and the n pillar region 28 is increased. By providing the n control region 32 in the MOSFET 100, a heat generation location when a short circuit occurs in a load can be moved to a deep position of the silicon carbide layer 10. Therefore, for example, melting of the source electrode 12 due to heat generation is suppressed, and short circuit resistance of the MOSFET 100 is improved.

In addition, as will be described below, in the MOSFET 100, the p contact region 38 is disposed directly above the n control region 32, such that the short circuit resistance is improved.

Figure 9:
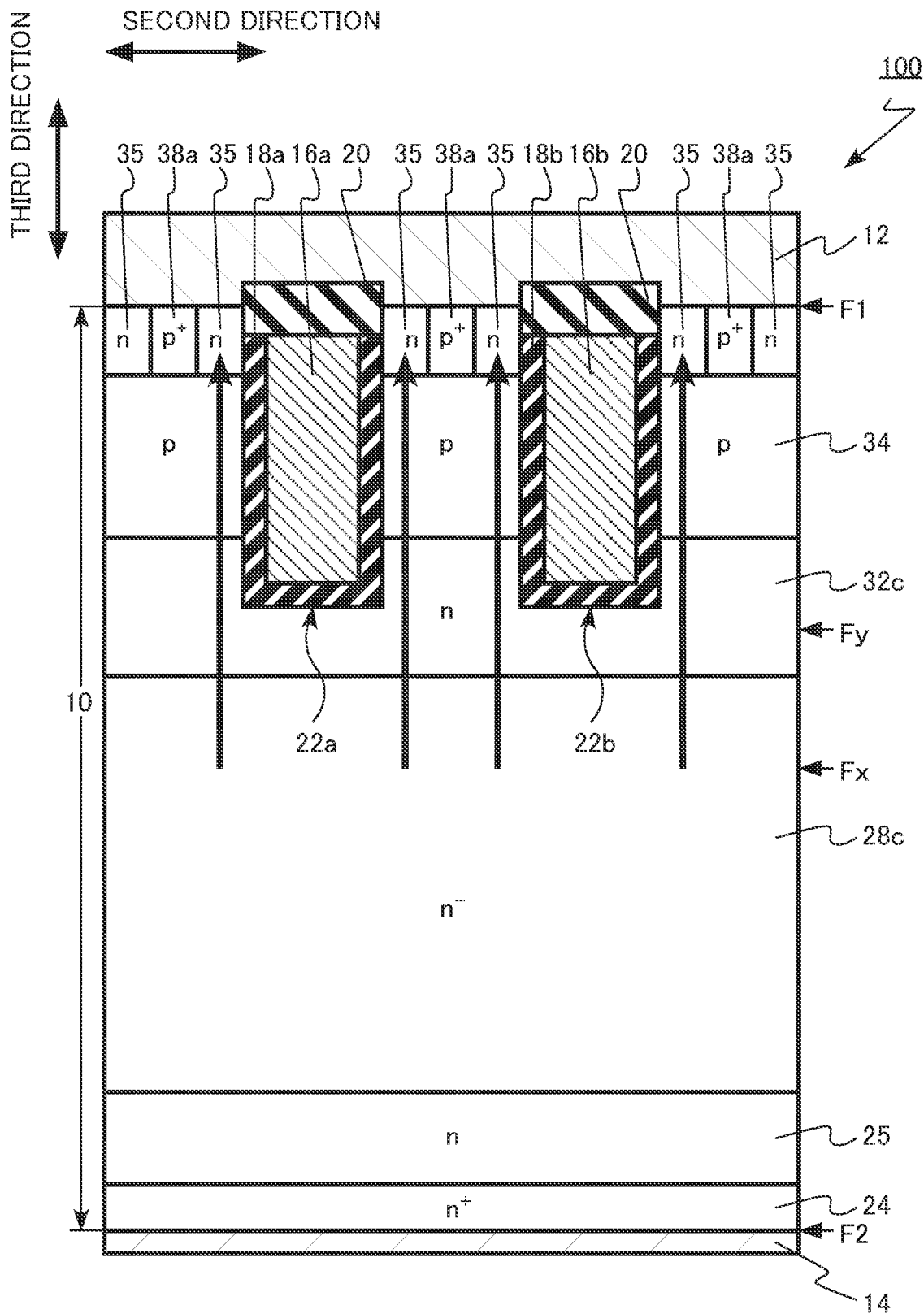
FIG. 9 is an explanatory view of a function and effect of the semiconductor device of the first embodiment.
Figure 10:
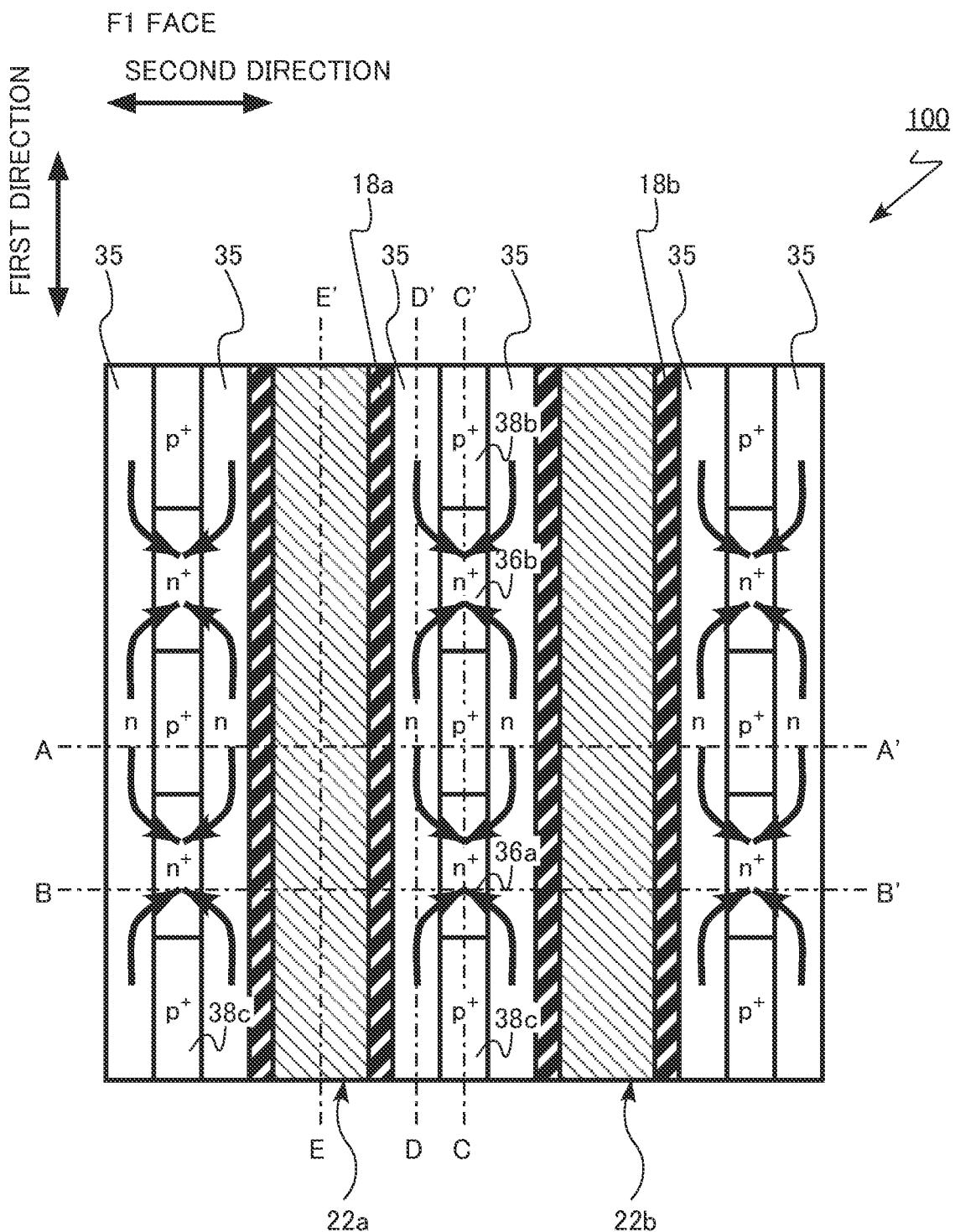
FIG. 10 is an explanatory view of the function and effect of the semiconductor device of the first embodiment.
Figure 11:
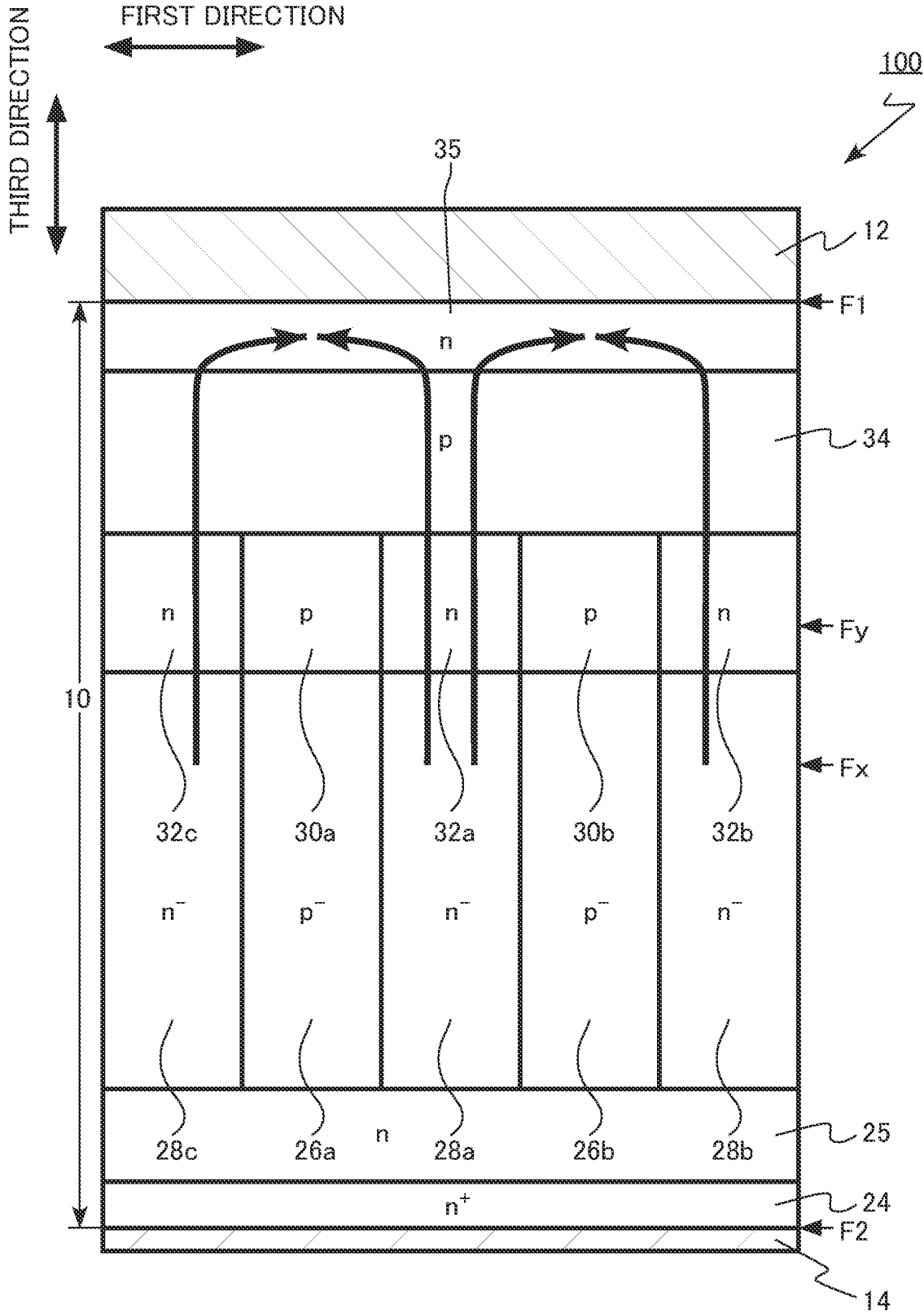
FIG. 11 is an explanatory view of the function and effect of the semiconductor device of the first embodiment.

FIGS. 9, 10, and 11 are explanatory views of the function and effect of the semiconductor device of the first embodiment. FIG. 9 is a cross section taken along line AA' of the MOSFET 100, FIG. 10 illustrates the first face F1 of the MOSFET 100, and FIG. 11 is a cross section taken along line DD' of the MOSFET 100. In FIGS. 9, 10, and 11, a current path when a short circuit occurs in a load and a large current flows through the MOSFET 100 is indicated by the black arrow.

As illustrated in FIG. 9, the current flows through the n control region 32 from the n pillar region 28, flows through the channel region where the body region 34 is in contact with the gate insulating layer 18, and reaches the source region 35. Since the contact resistance between the low-concentration source region 35 and the source electrode 12 is high, the current is less likely to pass through above the source region 35 to the source electrode 12.

In a portion where the p contact region 38 is adjacent to the source region 35 in the second direction, the current flows through the source region 35 in the first direction so as to bypass the p contact region 38, as illustrated in FIGS. 10 and 11. Then, as illustrated in FIG. 10, the current flows from the source region 35 to the n contact region 36. Thereafter, the current passes through the source electrode 12 from above the n contact region 36.

When a short circuit occurs in a load and a large current flows through the MOSFET 100, the current path is narrowed in the source region 35. Therefore, a saturation current of the MOSFET 100 is suppressed. Therefore, the short circuit resistance of the MOSFET 100 is improved.

On the contrary, unlike the MOSFET 100, in a case where the n contact region 36 is disposed directly above the n control region 32, the current that has reached the source region 35 that does not bypass the p contact region 38 but flows through the n contact region 36 adjacent to the source region 35. Therefore, the current path is not narrowed in the source region 35, and the saturation current of the MOSFET 100 is not suppressed.

In addition, as illustrated in FIG. 5, the MOSFET 100 has the p control regions 30 on both sides of the n control region 32 in the first direction. By providing the p control region 30, a width of the depletion layer extending from the n control region 32 to the channel formation region of the body region 34 is suppressed when the MOSFET 100 is turned off. Therefore, a short channel effect of the MOSFET 100 is suppressed, and an off-leakage current is reduced. Therefore, for example, the depth of the body region 34 of the MOSFET 100 can be shallow.

From the viewpoint of improving the short circuit resistance of the MOSFET 100, the area of the p contact region 38 provided in the third direction of the n control region 32 on the first face F1 is preferably larger than the area of the n contact region 36 provided in the third direction of the n control region 32 on the first face F1.

From the viewpoint of reducing the on-resistance of the MOSFET 100, the area of the n contact region 36 provided in the third direction of the p control region 30 on the first face F1 is preferably larger than the area of the p contact region 38 provided in the third direction of the p control region 30 on the first face F1.

From the viewpoint of improving the short circuit resistance of the MOSFET 100, a width of the p contact region 38 in the first direction is preferably lager than a width of the n contact region 36 in the first direction.

From the viewpoint of reducing the on-resistance of the MOSFET 100, the width of the n contact region 36 in the first direction is preferably lager than the width of the p contact region 38 in the first direction.

As described above, according to the first embodiment, a MOSFET capable of improving short circuit resistance can be realized.

Second Embodiment

A semiconductor device of a second embodiment is different from that of the first embodiment in that a distance between a fifth silicon carbide region and a seventh silicon carbide region in a first direction is smaller than a distance between a first silicon carbide region and a third silicon carbide region in the first direction. Hereinafter, some descriptions of contents overlapping with the first embodiment may be omitted.

Figure 12:
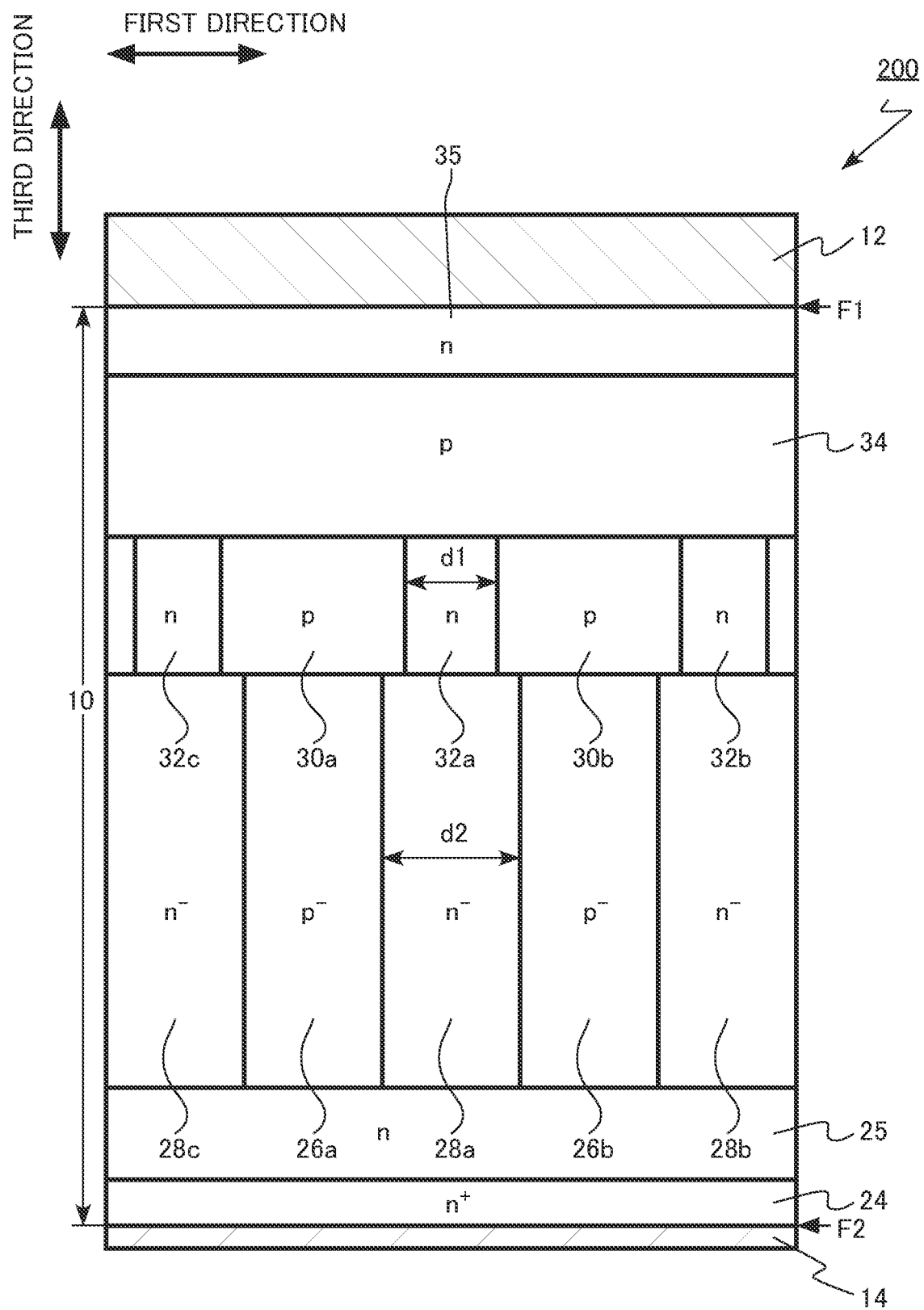
FIG. 12 is a schematic cross-sectional view of a semiconductor device of a second embodiment.

FIG. 12 is a schematic cross-sectional view of the semiconductor device of the second embodiment. FIG. 12 is a view corresponding to FIG. 5 of the first embodiment.

The semiconductor device of the second embodiment is a vertical MOSFET 200 of a trench gate type using silicon carbide. The MOSFET 200 is a MOSFET of an re-channel type using electrons as carriers.

A distance (d1 in FIG. 12) between a first p control region 30a and a second p control region 30b in the first direction is smaller than a distance (d2 in FIG. 12) between a first p pillar region 26a and a second p pillar region 26b in the first direction. In other words, a width of a first n control region 32a in the first direction is smaller than a width of a first n pillar region 28a in the first direction. The width of the n control region 32 in the first direction is smaller than the width of the n pillar region 28 in the first direction.

In the MOSFET 200, the width of the n control region 32 in the first direction is smaller than the width of the n pillar region 28 in the first direction. Therefore, when a short circuit occurs in a load and a large current flows through the MOSFET 200, a current path is narrowed in the n control region 32. Therefore, a saturation current of the MOSFET 200 is suppressed. Therefore, the short circuit resistance is improved in comparison to that of the MOSFET 100.

As described above, according to the second embodiment, a MOSFET capable of improving short circuit resistance can be realized.

Third Embodiment

A semiconductor device of a third embodiment is different from that of the first embodiment in that a tenth silicon carbide region extends in a first direction, an eleventh silicon carbide region extends in the first direction, and the eleventh silicon carbide region is disposed in a second direction with respect to the tenth silicon carbide region. Hereinafter, some descriptions of contents overlapping with the first embodiment may be omitted.

Figure 13:
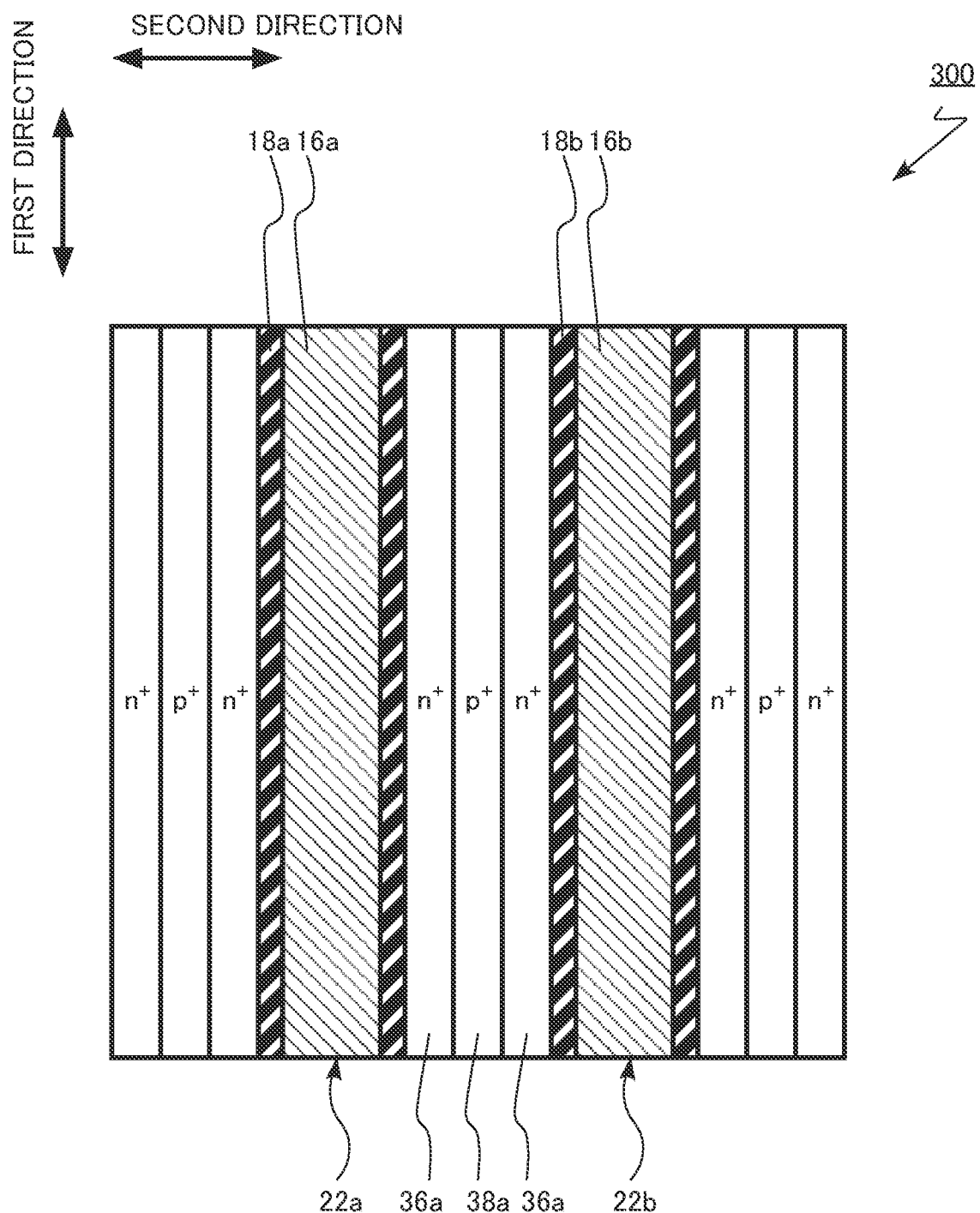
FIG. 13 is a schematic plan view of a semiconductor device of a third embodiment.

FIG. 13 is a schematic plan view of the semiconductor device of the third embodiment. FIG. 13 is a view corresponding to FIG. 2 of the first embodiment.

The semiconductor device of the third embodiment is a vertical MOSFET 300 of a trench gate type using silicon carbide. The MOSFET 300 is a MOSFET of an n-channel type using electrons as carriers.

An $n^+$-type first n contact region 36a (tenth silicon carbide region) extends in the first direction. A $p^+$-type first p contact region 38a (eleventh silicon carbide region) extends in the first direction. The first p contact region 38a is disposed in the second direction with respect to the first n contact region 36a.

Similar to the MOSFET 100 of the first embodiment, the MOSFET 300 has an n control region 32 having an n-type impurity concentration higher than that in an n pillar region 28, the n control region 32 being provided on the n pillar region 28 serving as a current path when the MOSFET 300 is turned on. That is, the MOSFET 300 has the n control region 32 having a higher n-type impurity concentration and a lower electrical resistance than in the n pillar region 28.

Therefore, a heat generation location when a short circuit occurs in a load can be moved to a deep position of a silicon carbide layer 10. Therefore, for example, melting of a source electrode 12 due to heat generation is suppressed, and short circuit resistance of the MOSFET 300 is improved.

As described above, according to the third embodiment, a MOSFET capable of improving short circuit resistance can be realized.

Fourth Embodiment

A semiconductor device of a fourth embodiment includes: a silicon carbide layer having a first face parallel to a first direction and a second direction orthogonal to the first direction, and a second face facing the first face; a first trench provided on a side of the first face in the silicon carbide layer and extending in the first direction; a second trench provided on the side of the first face in the silicon carbide layer, provided in the second direction with respect to the first trench, and extending in the first direction; a first gate electrode provided in the first trench; a second gate electrode provided in the second trench; a first gate insulating layer provided between the first gate electrode and the silicon carbide layer; a second gate insulating layer provided between the second gate electrode and the silicon carbide layer; a first silicon carbide region of a first conductive type provided in the silicon carbide layer and extending in the first direction; a second silicon carbide region of a second conductive type provided in the silicon carbide layer, extending in the first direction, and disposed in the second direction with respect to the first silicon carbide region; a third silicon carbide region of a first conductive type provided in the silicon carbide layer, extending in the first direction, and disposed in the second direction with respect to the second silicon carbide region; a fourth silicon carbide region of a second conductive type provided in the silicon carbide layer, extending in the first direction, and disposed in the second direction with respect to the third silicon carbide region; a fifth silicon carbide region of a first conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a first-conductivity type impurity concentration higher than a first-conductivity type impurity concentration in the first silicon carbide region; a sixth silicon carbide region of a second conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a second-conductivity type impurity concentration higher than a second-conductivity type impurity concentration in the second silicon carbide region; a seventh silicon carbide region of a first conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a first-conductivity type impurity concentration higher than the first-conductivity type impurity concentration in the first silicon carbide region; an eighth silicon carbide region of a second conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a second-conductivity type impurity concentration higher than the second-conductivity type impurity concentration in the second silicon carbide region; a ninth silicon carbide region of a first conductive type provided in the silicon carbide layer, disposed between the fifth silicon carbide region and the first face, between the sixth silicon carbide region and the first face, between the seventh silicon carbide region and the first face, between the eighth silicon carbide region and the first face, and disposed between the first trench and the second trench; a tenth silicon carbide region of a second conductive type provided in the silicon carbide layer, disposed between the ninth silicon carbide region and the first face, and disposed between the first trench and the second trench; an eleventh silicon carbide region of a first conductive type provided in the silicon carbide layer, disposed between the ninth silicon carbide region and the first face, disposed between the first trench and the second trench, and having a first-conductivity type impurity concentration higher than a first-conductivity type impurity concentration in the ninth silicon carbide region; a first electrode provided on the side of the first face with respect to the silicon carbide layer and in contact with the tenth silicon carbide region and the eleventh silicon carbide region; and a second electrode provided on a side of the second face with respect to the silicon carbide layer. The semiconductor device of the fourth embodiment is different from that of the first embodiment in that the first silicon carbide region, the second silicon carbide region, the third silicon carbide region, and the fourth silicon carbide region extend in the first direction. Hereinafter, some descriptions of contents overlapping with the first embodiment may be omitted.

Hereinafter, a case where a first conductive type is a p-type and a second conductive type is an n-type will be described by way of example.

Figure 14:
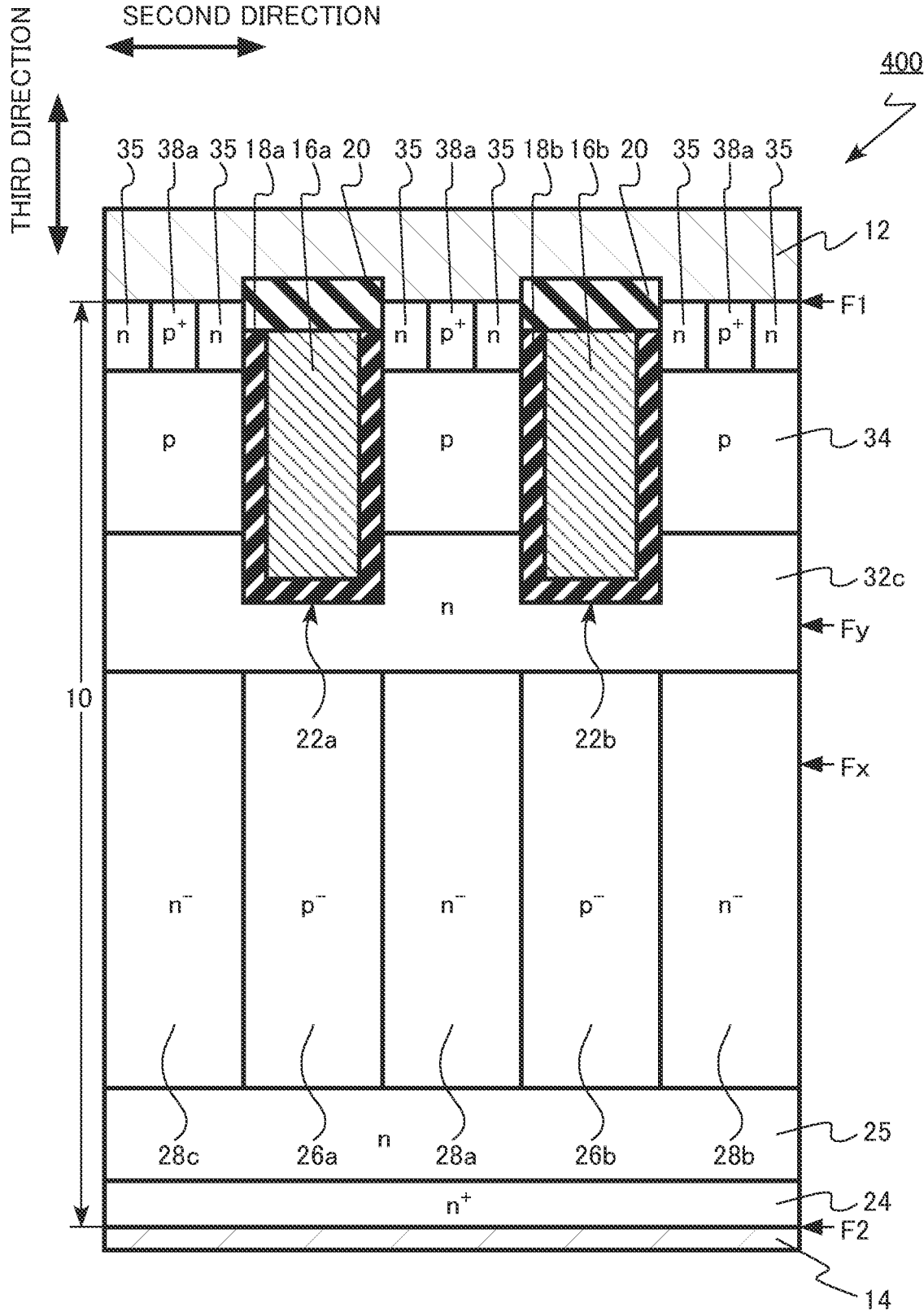
FIG. 14 is a schematic cross-sectional view of a semiconductor device of a fourth embodiment.

FIG. 14 is a schematic cross-sectional view of the semiconductor device of the fourth embodiment. FIG. 14 is a cross section taken along line AA' of FIG. 15.

Figure 15:
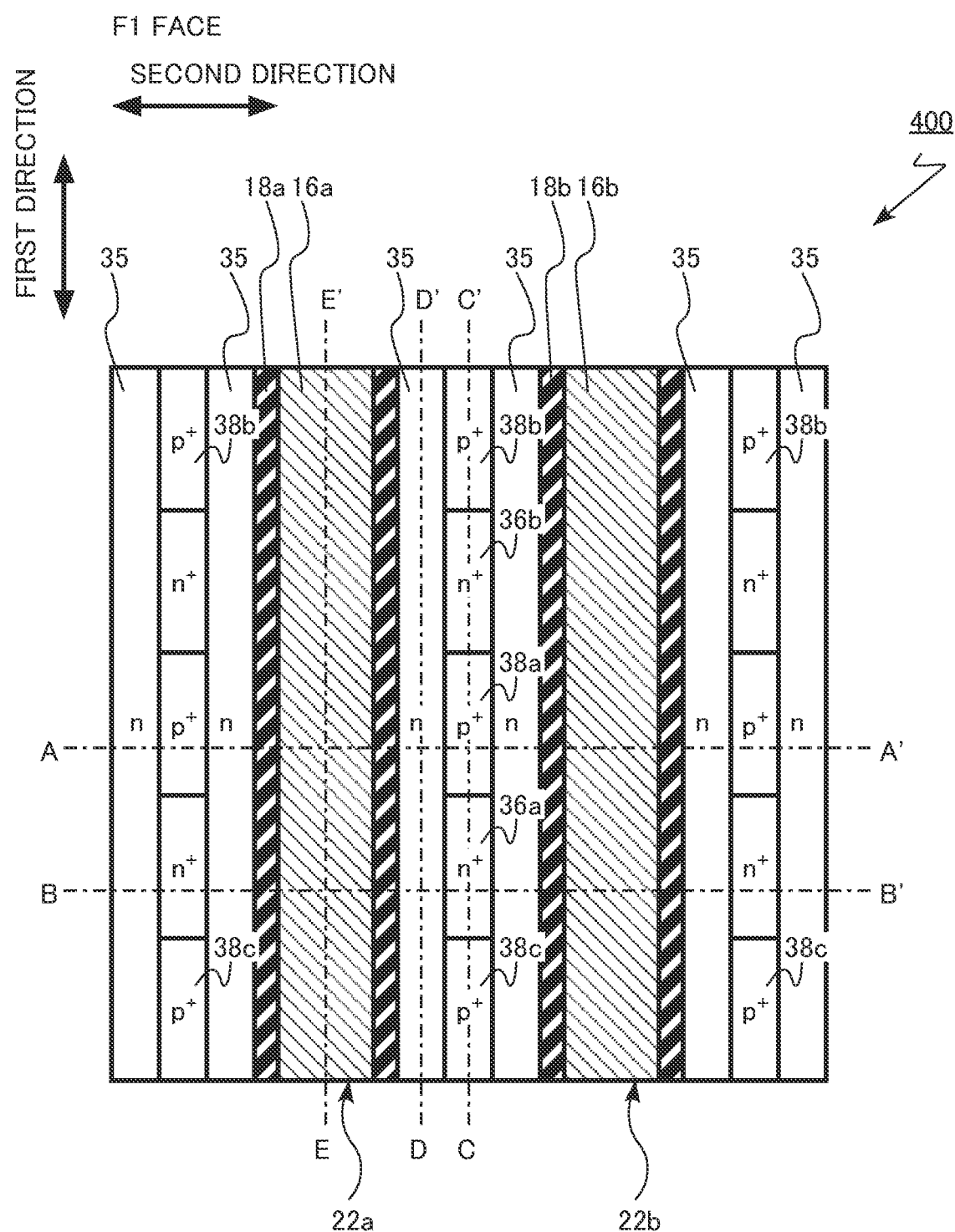
FIG. 15 is a schematic plan view of the semiconductor device of the fourth embodiment.

FIG. 15 is a schematic plan view of the semiconductor device of the fourth embodiment. FIG. 15 is a plan view of the first face of FIG. 14 (F1 in FIG. 14).

Figure 16:
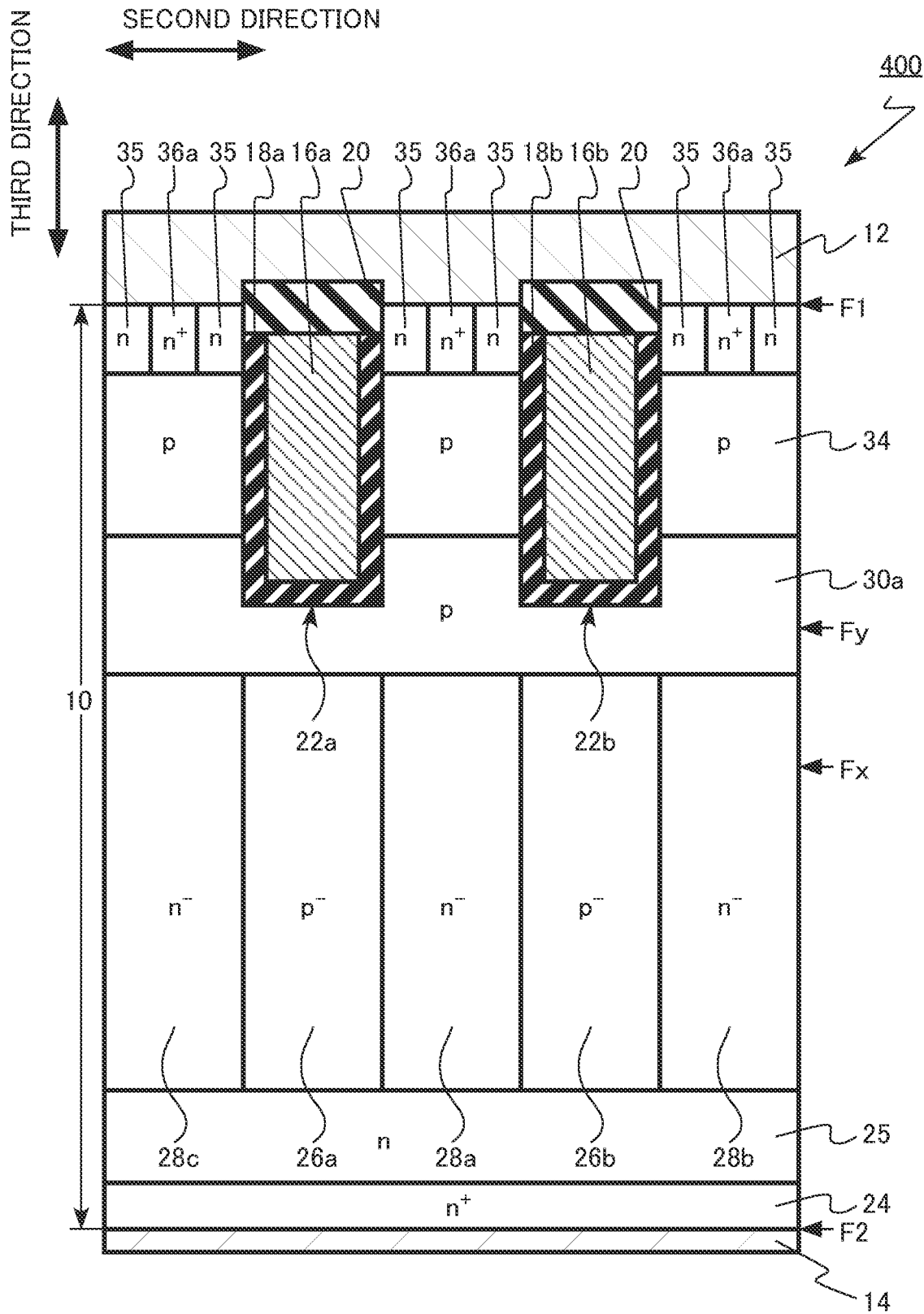
FIG. 16 is a schematic cross-sectional view of the semiconductor device of the fourth embodiment.

FIG. 16 is a schematic cross-sectional view of the semiconductor device of the fourth embodiment. FIG. 16 is a cross section taken along line BB' of FIG. 15.

Figure 17:
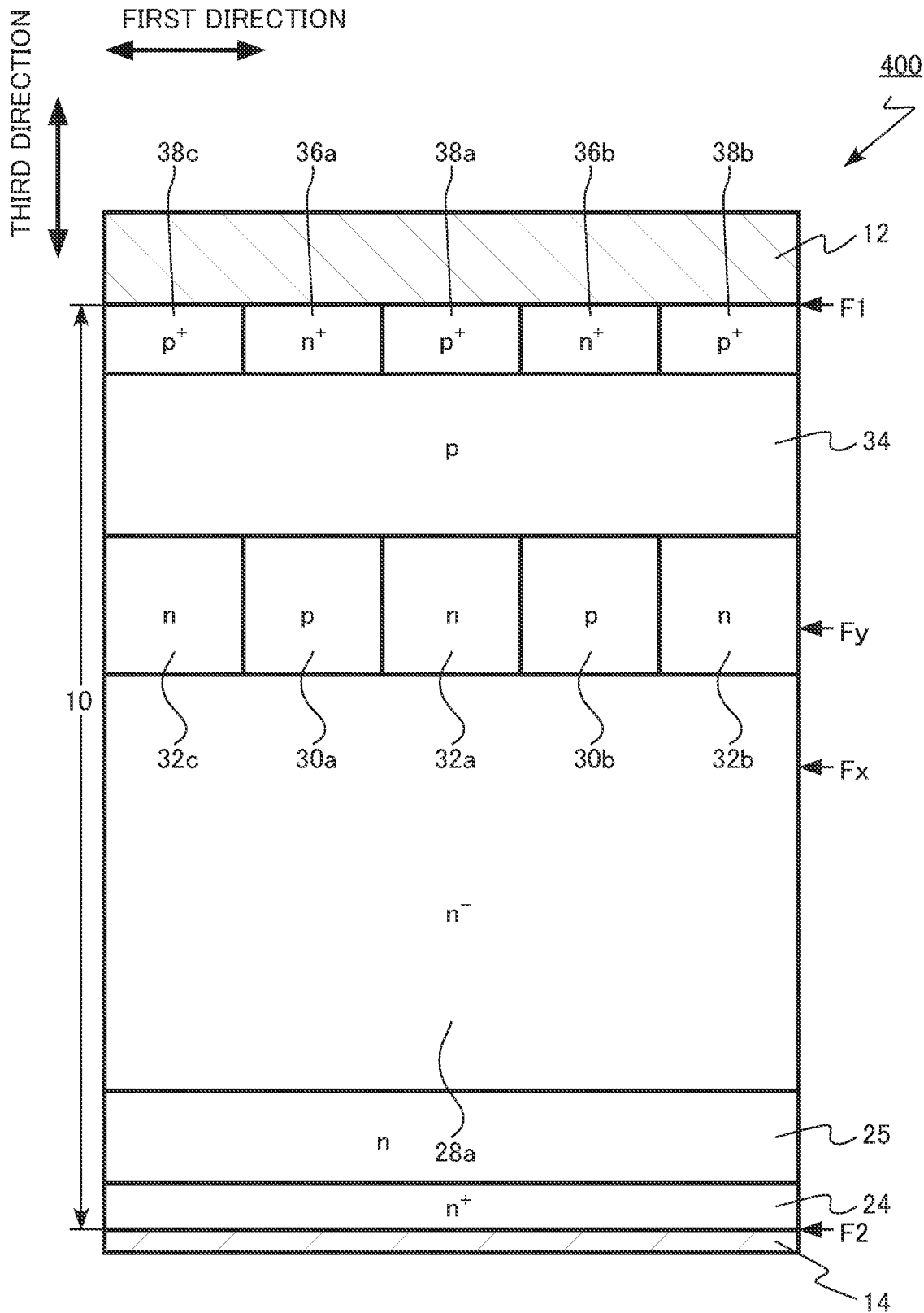
FIG. 17 is a schematic cross-sectional view of the semiconductor device of the fourth embodiment.

FIG. 17 is a schematic cross-sectional view of the semiconductor device of the fourth embodiment. FIG. 17 is a cross section taken along line CC' of FIG. 15.

Figure 18:
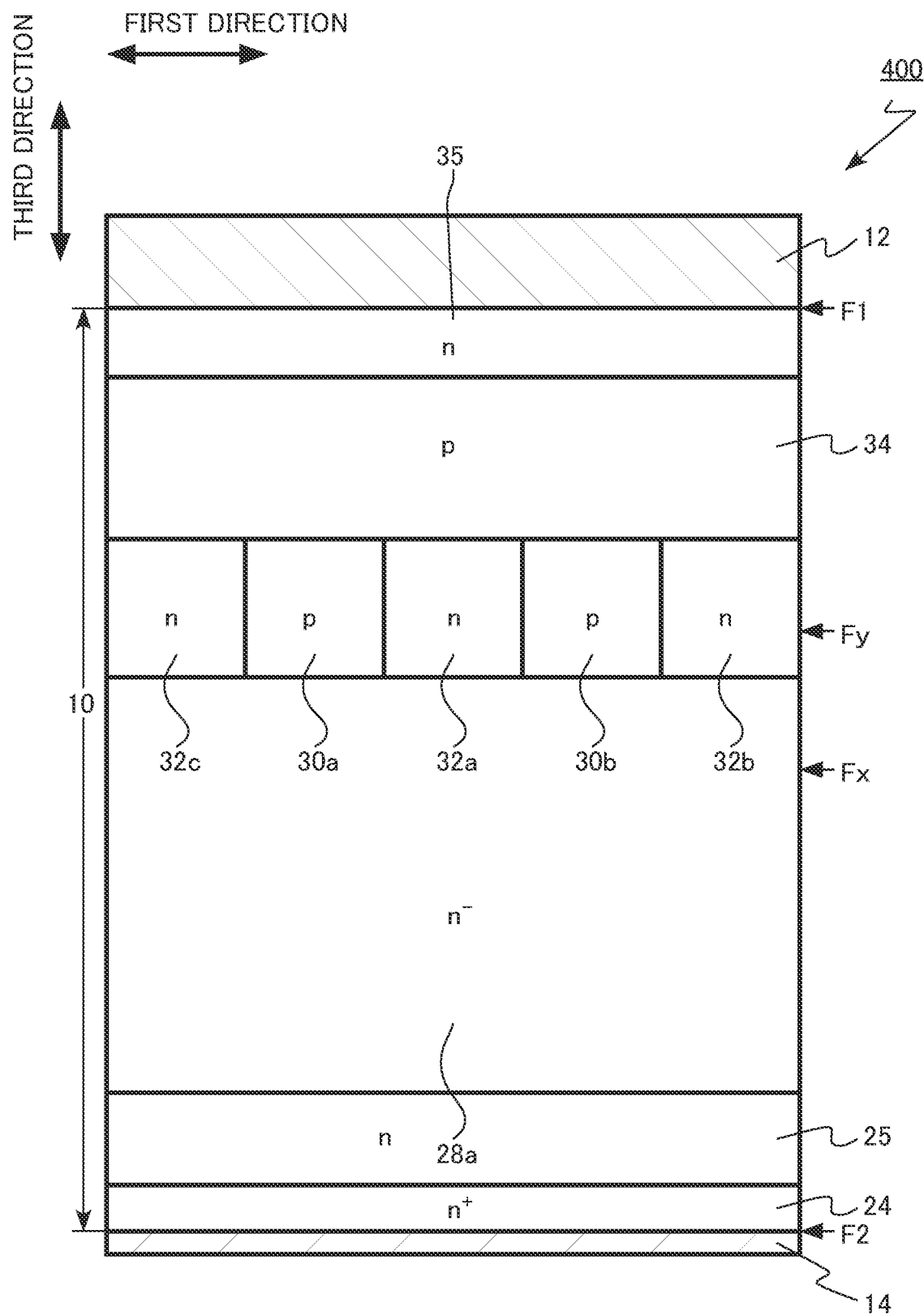
FIG. 18 is a schematic cross-sectional view of the semiconductor device of the fourth embodiment.

FIG. 18 is a schematic cross-sectional view of the semiconductor device of the fourth embodiment. FIG. 18 is a cross section taken along line DD' of FIG. 15.

Figure 19:
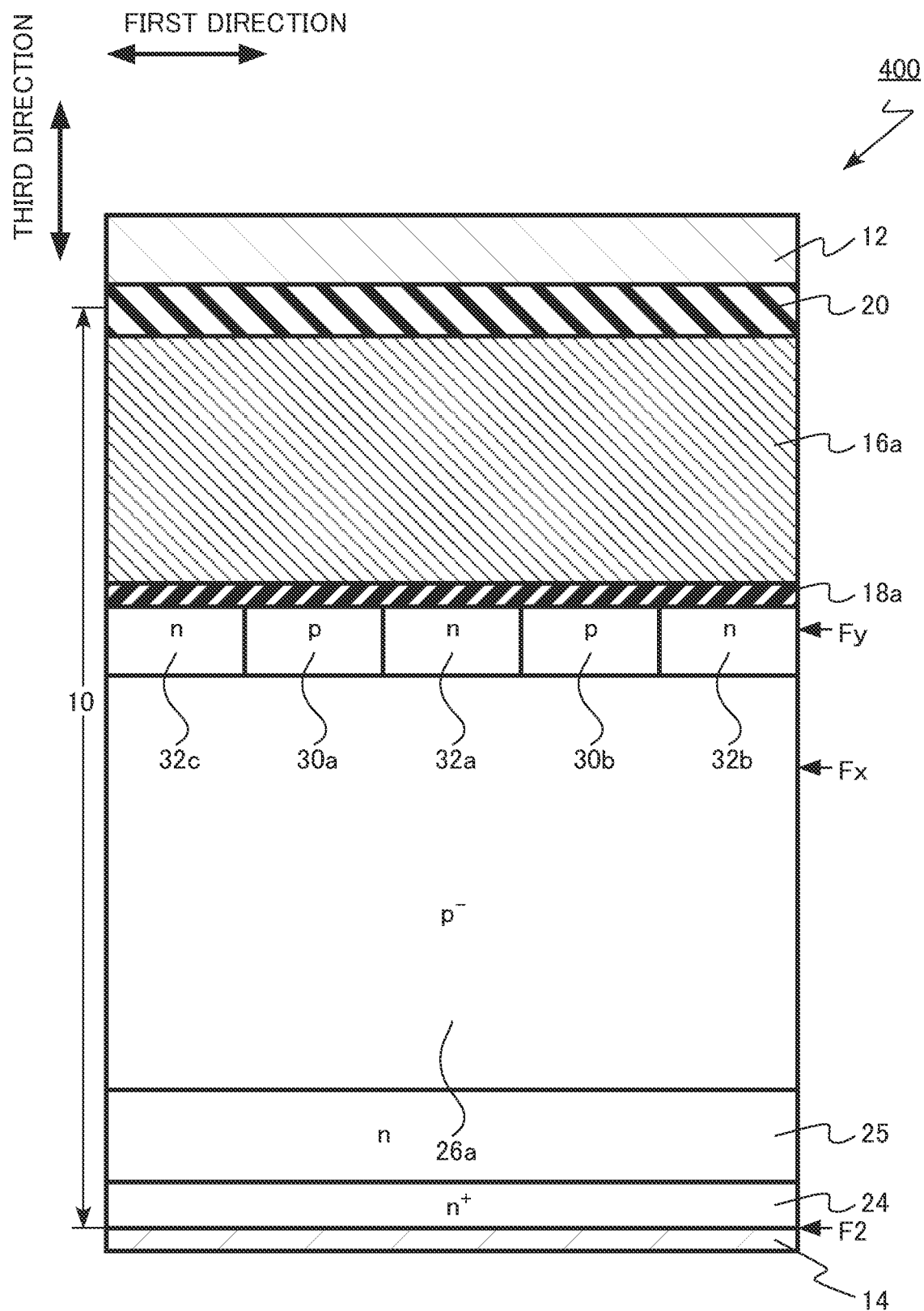
FIG. 19 is a schematic cross-sectional view of the semiconductor device of the fourth embodiment.

FIG. 19 is a schematic cross-sectional view of the semiconductor device of the fourth embodiment. FIG. 19 is a cross section taken along line EE' of FIG. 15.

Figure 20:
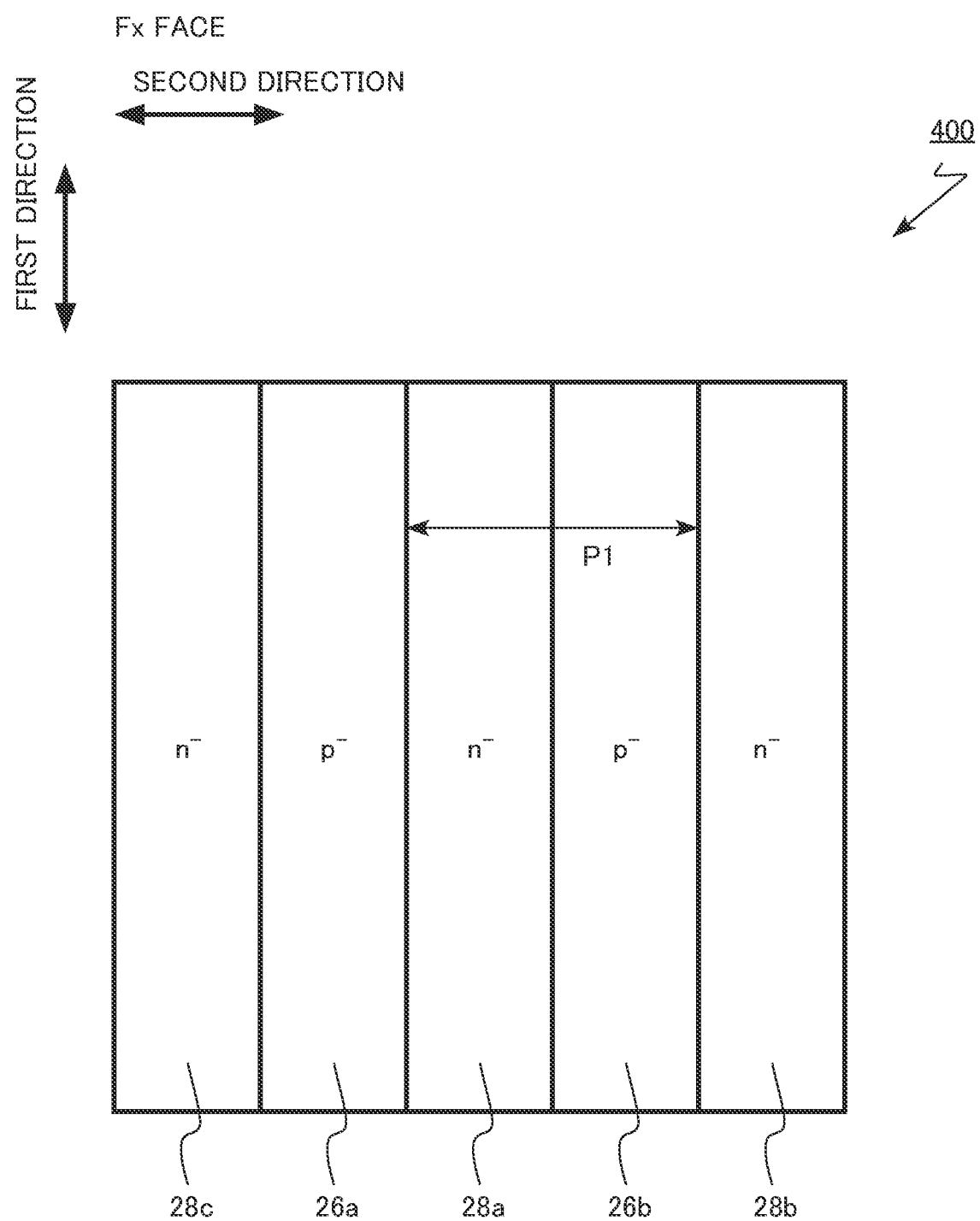
FIG. 20 is a schematic cross-sectional view of the semiconductor device of the fourth embodiment.

FIG. 20 is a schematic cross-sectional view of the semiconductor device of the fourth embodiment. FIG. 20 is a cross section of Fx of FIG. 14.

Figure 21:
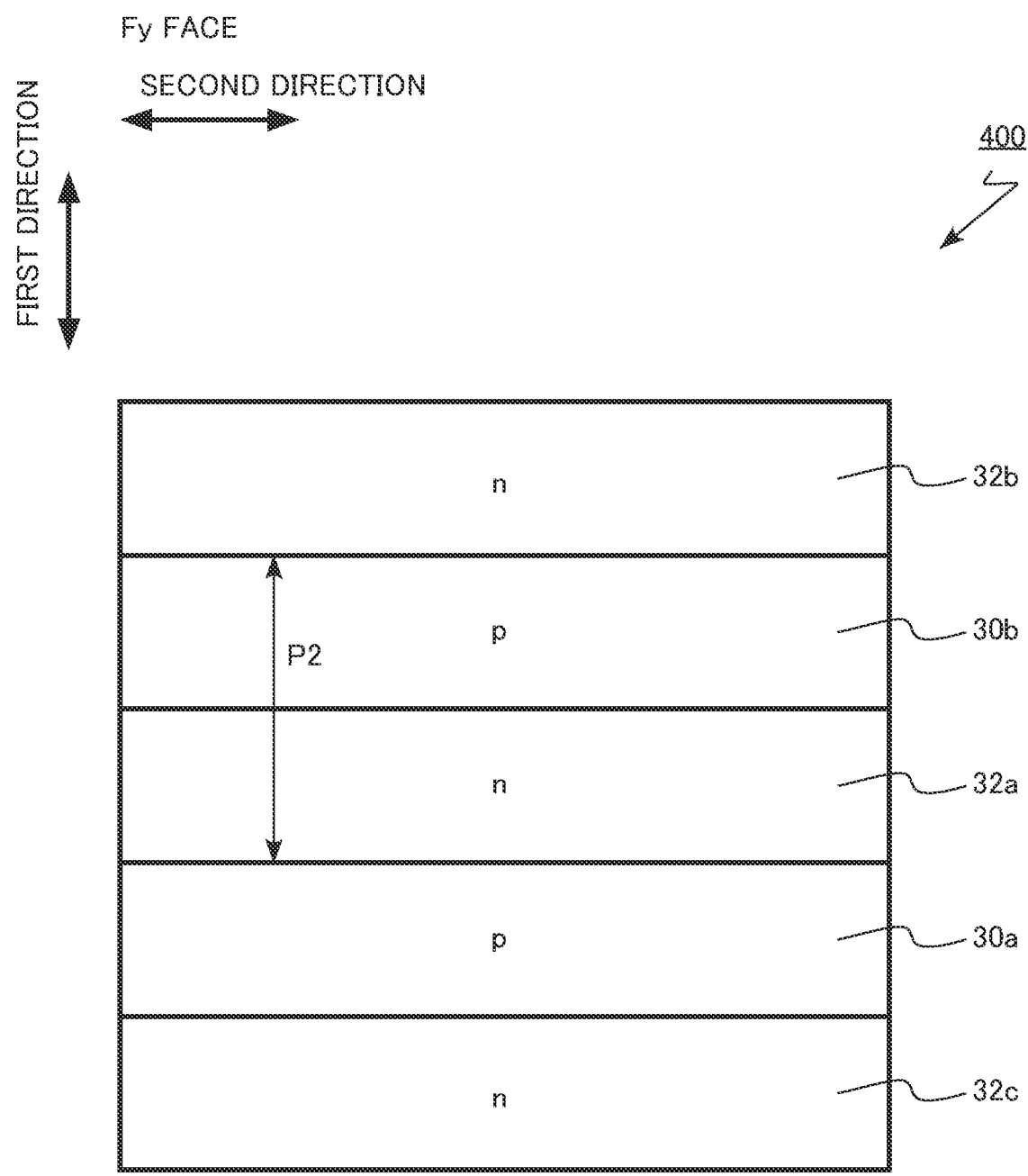
FIG. 21 is a schematic cross-sectional view of the semiconductor device of the fourth embodiment.

FIG. 21 is a schematic cross-sectional view of the semiconductor device of the fourth embodiment. FIG. 21 is a cross section in Fy of FIG. 14.

The semiconductor device of the fourth embodiment is a MOSFET 400 of a trench gate type using silicon carbide. The MOSFET 400 is a MOSFET of an n-channel type using electrons as carriers.

The MOSFET 400 has a super junction structure (hereinafter, also referred to as an "SJ structure").

The MOSFET 400 includes a silicon carbide layer 10, a source electrode 12 (first electrode), a drain electrode 14 (second electrode), a first gate electrode 16a, a second gate electrode 16b, a first gate insulating layer 18a, a second gate insulating layer 18b, an interlayer insulating layer 20, a first trench 22a, and a second trench 22b.

In the silicon carbide layer 10, an $n^+$-type drain region 24, an n-type buffer region 25, a $p^-$-type first p pillar region 26a (first silicon carbide region), a $p^-$-type second p pillar region 26b (third silicon carbide region), an $n^-$-type first n pillar region 28a (second silicon carbide region), an $n^-$-type second n pillar region 28b (fourth silicon carbide region), an $n^-$-type third n pillar region 28c, a p-type first p control region 30a (fifth silicon carbide region), a p-type second p control region 30b (seventh silicon carbide region), an n-type first n control region 32a (sixth silicon carbide region), an n-type second n control region 32b (eighth silicon carbide region), an n-type third n control region 32c, a p-type body region 34 (ninth silicon carbide region), an n-type source region 35 (fourteenth silicon carbide region), an $n^+$-type first n contact region 36a (tenth silicon carbide region), an $n^+$-type second n contact region 36b (twelfth silicon carbide region), a $p^+$-type first p contact region 38a (eleventh silicon carbide region), a $p^+$-type second p contact region 38b (thirteenth silicon carbide region), and a $p^+$-type third p contact region 38c are provided.

Hereinafter, the first gate electrode 16a and the second gate electrode 16b may be collectively referred to as a gate electrode 16. In addition, the first gate insulating layer 18a and the second gate insulating layer 18b may be collectively referred to as a gate insulating layer 18. In addition, the first trench 22a and the second trench 22b may be collectively referred to as a trench 22.

Hereinafter, the first p pillar region 26a and the second p pillar region 26b may be collectively referred to as a p pillar region 26. In addition, the first n pillar region 28a, the second n pillar region 28b, and the third n pillar region 28c may be collectively referred to as an n pillar region 28. In addition, the first p control region 30a and the second p control region 30b may be collectively referred to as a p control region 30. In addition, the first n control region 32a, the second n control region 32b, and the third n control region 32c may be collectively referred to as an n control region 32. In addition, the first n contact region 36a and the second n contact region 36b may be collectively referred to as an n contact region 36. In addition, the first p contact region 38a, the second p contact region 38b, and the third p contact region 38c may be collectively referred to as a p contact region 38.

The $p^-$-type first p pillar region 26a is provided between the buffer region 25 and the surface of the silicon carbide layer 10. As illustrated in FIG. 20, the first p pillar region 26a extends in the first direction.

The first trench 22a is disposed, for example, in the third direction with respect to the first p pillar region 26a. The first trench 22a is disposed, for example, directly above the first p pillar region 26a.

The n⁻-type first n pillar region 28a is provided between the buffer region 25 and the surface of the silicon carbide layer 10. As illustrated in FIG. 20, the first n pillar region 28a extends in the first direction. In addition, the first n pillar region 28a is disposed in the second direction with respect to the first p pillar region 26a. The first n pillar region 28a is in contact with the first p pillar region 26a.

The body region 34 is disposed, for example, in the third direction with respect to the first n pillar region 28a. The body region 34 is disposed, for example, directly above the first n pillar region 28a.

The p⁻-type second p pillar region 26b is provided between the buffer region 25 and the surface of the silicon carbide layer 10. As illustrated in FIG. 20, the second p pillar region 26b extends in the first direction. The second p pillar region 26b is disposed in the second direction with respect to the first n pillar region 28a. The second p pillar region 26b is in contact with the first n pillar region 28a.

The second trench 22b is disposed in the third direction with respect to the second p pillar region 26b. The second trench 22b is disposed directly above the second p pillar region 26b.

The n⁻-type second n pillar region 28b is provided between the buffer region 25 and the surface of the silicon carbide layer 10. As illustrated in FIG. 20, the second n pillar region 28b extends in the first direction. In addition, the second n pillar region 28b is disposed in the second direction with respect to the second p pillar region 26b. The second n pillar region 28b is in contact with the second p pillar region 26b.

The body region 34 is disposed, for example, in the third direction with respect to the second n pillar region 28b. The body region 34 is disposed, for example, directly above the second n pillar region 28b.

The n⁻-type third n pillar region 28c is provided between the buffer region 25 and the surface of the silicon carbide layer 10. As illustrated in FIG. 20, the third n pillar region 28c extends in the first direction. In addition, the third n pillar region 28c is disposed in the second direction with respect to the first p pillar region 26a. The third n pillar region 28c is in contact with the first p pillar region 26a. The first p pillar region 26a is disposed between the third n pillar region 28c and the first n pillar region 28a.

The p pillar region 26 contains, for example, aluminum (Al) as p-type impurities. A p-type impurity concentration in the p pillar region 26 is, for example, equal to or more than $5 \times 10^{15}$ cm$^{-3}$ and equal to or less than $5 \times 10^{17}$ cm$^{-3}$.

The n pillar region 28 contains, for example, nitrogen (N) as n-type impurities. An n-type impurity concentration in the n pillar region 28 is lower than the n-type impurity concentration in the buffer region 25. The n-type impurity concentration in the n pillar region 28 is for example, equal to or more than $5 \times 10^{15}$ cm$^{-3}$ and equal to or less than $5 \times 10^{17}$ cm$^{-3}$.

The p pillar regions 26 and the n pillar regions 28 are alternately disposed in the second direction. The p pillar regions 26 and the n pillar regions 28 form an SJ structure. The SJ structure has a function of improving a breakdown voltage of the MOSFET 400.

A repetition pitch (P1 in FIG. 20) of the p pillar region 26 and the n pillar region 28 in the second direction is, for example, equal to or more than 1.5 µm and equal to or less than 6 µm.

The p-type first p control region 30a is disposed between the first p pillar region 26a and the surface of the silicon carbide layer 10, between the first n pillar region 28a and the surface of the silicon carbide layer 10, between the second p pillar region 26b and the surface of the silicon carbide layer 10, and between the second n pillar region 28b and the surface of the silicon carbide layer 10.

As illustrated in FIG. 21, the first p control region 30a extends in the second direction. The first p control region 30a is disposed between the trench 22 and the back surface of the silicon carbide layer 10. The first p control region 30a is in contact with, for example, a bottom face of the first trench 22a and a bottom face of the second trench 22b.

The n-type first n control region 32a is disposed between the first p pillar region 26a and the surface of the silicon carbide layer 10, between the first n pillar region 28a and the surface of the silicon carbide layer 10, between the second p pillar region 26b and the surface of the silicon carbide layer 10, and between the second n pillar region 28b and the surface of the silicon carbide layer 10.

As illustrated in FIG. 21, the first n control region 32a extends in the second direction. In addition, the first n control region 32a is disposed in the first direction with respect to the first p control region 30a. The first n control region 32a is in contact with the first p control region 30a.

The first n control region 32a is disposed between the trench 22 and the back surface of the silicon carbide layer 10. The first n control region 32a is in contact with the bottom face of the first trench 22a and the bottom face of the second trench 22b.

The p-type second p control region 30b is disposed between the first p pillar region 26a and the surface of the silicon carbide layer 10, between the first n pillar region 28a and the surface of the silicon carbide layer 10, between the second p pillar region 26b and the surface of the silicon carbide layer 10, and between the second n pillar region 28b and the surface of the silicon carbide layer 10.

As illustrated in FIG. 21, the second p control region 30b extends in the second direction. The second p control region 30b is disposed in the first direction with respect to the first n control region 32a. The second p control region 30b is in contact with the first n control region 32a.

The second p control region 30b is disposed between the trench 22 and the back surface of the silicon carbide layer 10. The second p control region 30b is in contact with, for example, the bottom face of the first trench 22a and the bottom face of the second trench 22b.

The n-type second n control region 32b is disposed between the first p pillar region 26a and the surface of the silicon carbide layer 10, between the first n pillar region 28a and the surface of the silicon carbide layer 10, between the second p pillar region 26b and the surface of the silicon carbide layer 10, and between the second n pillar region 28b and the surface of the silicon carbide layer 10.

As illustrated in FIG. 21, the second n control region 32b extends in the second direction. In addition, the second n control region 32b is disposed in the first direction with respect to the second p control region 30b.

The second n control region 32b is in contact with the second p control region 30b.

The second n control region 32b is disposed between the trench 22 and the back surface of the silicon carbide layer 10. The second n control region 32b is in contact with the bottom face of the first trench 22a and the bottom face of the second trench 22b.

The n-type third n control region 32c is disposed between the first p pillar region 26a and the surface of the silicon carbide layer 10, between the first n pillar region 28a and the surface of the silicon carbide layer 10, between the second p pillar region 26b and the surface of the silicon carbide layer 10, and between the second n pillar region 28b and the surface of the silicon carbide layer 10.

As illustrated in FIG. 21, the third n control region 32c extends in the second direction. In addition, the third n control region 32c is disposed in the first direction with respect to the first p control region 30a. The third n control region 32c is in contact with the first p control region 30a.

The third n control region 32c is disposed between the trench 22 and the back surface of the silicon carbide layer 10. The third n control region 32c is in contact with the bottom face of the first trench 22a and the bottom face of the second trench 22b.

The p control region 30 contains, for example, aluminum (Al) as p-type impurities. A p-type impurity concentration in the p control region 30 is higher than the p-type impurity concentration in the p pillar region 26. The p-type impurity concentration in the p control region 30 is, for example, equal to or more than $5 \times 10^{16}$ cm$^{-3}$ and equal to or less than $5 \times 10^{18}$ cm$^{-3}$.

The n control region 32 contains, for example, nitrogen (N) as n-type impurities. An n-type impurity concentration in the n control region 32 is higher than the n-type impurity concentration in the n pillar region 28. The n-type impurity concentration in the n control region 32 is for example, equal to or more than $5 \times 10^{16}$ cm$^{-3}$ and equal to or less than $1 \times 10^{18}$ cm$^{-3}$.

A plurality of p control regions 30 and a plurality of n control regions 32 are alternately disposed in the first direction. The p control regions 30 and the n control regions 32 have a function of improving the short circuit resistance of the MOSFET 400.

The p control regions 30 face, for example, the bottom face of the trench 22. The p control region 30 has a function of improving reliability of the gate insulating layer 18.

A repetition pitch (P2 in FIG. 21) of the p control region 30 and the n control region 32 in the first direction is, for example, equal to the repetition pitch (P1 in FIG. 20) of the p pillar region 26 and the n pillar region 28 in the second direction. The repetition pitch of the p control region 30 and the n control region 32 in the first direction is, for example, equal to or more than 1.0 μm and equal to or less than 5.0 μm.

Next, a function and effect of the semiconductor device of the fourth embodiment will be described.

By applying the trench gate structure, a channel area per unit area is increased, and the on-resistance of the MOSFET 400 is reduced.

In addition, the MOSFET 400 has the SJ structure. Therefore, the breakdown voltage of the MOSFET 400 is improved.

When a short circuit occurs in a load driven using a MOSFET, a large current flows through the MOSFET, and the MOSFET is broken down. The time until breakdown of the MOSFET occurs is referred to as short circuit resistance. From the viewpoint of improving reliability of the MOSFET, it is desirable to improve the short circuit resistance.

The MOSFET 400 has the n control region 32 having an n-type impurity concentration higher than that in the n pillar region 28, the n control region 32 being provided on the n pillar region 28 serving as a current path when the MOSFET 400 is turned on. By providing the n control region 32 in the MOSFET 400, a heat generation location when a short circuit occurs in a load can be moved to a deep position of the silicon carbide layer 10. Therefore, melting of a source electrode 12 due to heat generation is suppressed, and short circuit resistance of the MOSFET 400 is improved.

In addition, in the MOSFET 400, the p contact region 38 is disposed directly above the n control region 32, such that the short circuit resistance is improved.

In addition, in the MOSFET 400, as illustrated in FIG. 17, for example, the p control regions 30 are provided on both sides of the n control region 32 in the first direction. By providing the p control region 30, a width of the depletion layer extending from the n control region 32 to the channel formation region of the body region 34 is suppressed when the MOSFET 400 is turned off. Therefore, a short channel effect of the MOSFET 400 is suppressed, and an off-leakage current is reduced. Therefore, for example, a depth of the body region 34 of the MOSFET 400 can be shallow.

From the viewpoint of improving the short circuit resistance of the MOSFET 400, the area of the p contact region 38 provided in the third direction of the n control region 32 on the first face F1 is preferably larger than the area of the n contact region 36 provided in the third direction of the n control region 32 on the first face F1.

From the viewpoint of reducing the on-resistance of the MOSFET 400, the area of the n contact region 36 provided in the third direction of the p control region 30 on the first face F1 is preferably larger than the area of the p contact region 38 provided in the third direction of the p control region 30 on the first face F1.

From the viewpoint of improving the short circuit resistance of the MOSFET 400, a width of the p contact region 38 in the first direction is preferably lager than a width of the n contact region 36 in the first direction.

From the viewpoint of reducing the on-resistance of the MOSFET 400, the width of the n contact region 36 in the first direction is preferably lager than the width of the p contact region 38 in the first direction.

As described above, according to the fourth embodiment, a MOSFET capable of improving short circuit resistance can be realized.

Fifth Embodiment

A semiconductor device of a fifth embodiment is different from that of the fourth embodiment in that a distance between a first silicon carbide region and a fourth silicon carbide region in a second direction is larger than a distance between a fifth silicon carbide region and an eighth silicon carbide region in a first direction. Hereinafter, some descriptions of contents overlapping with the fourth embodiment may be omitted.

Figure 22:
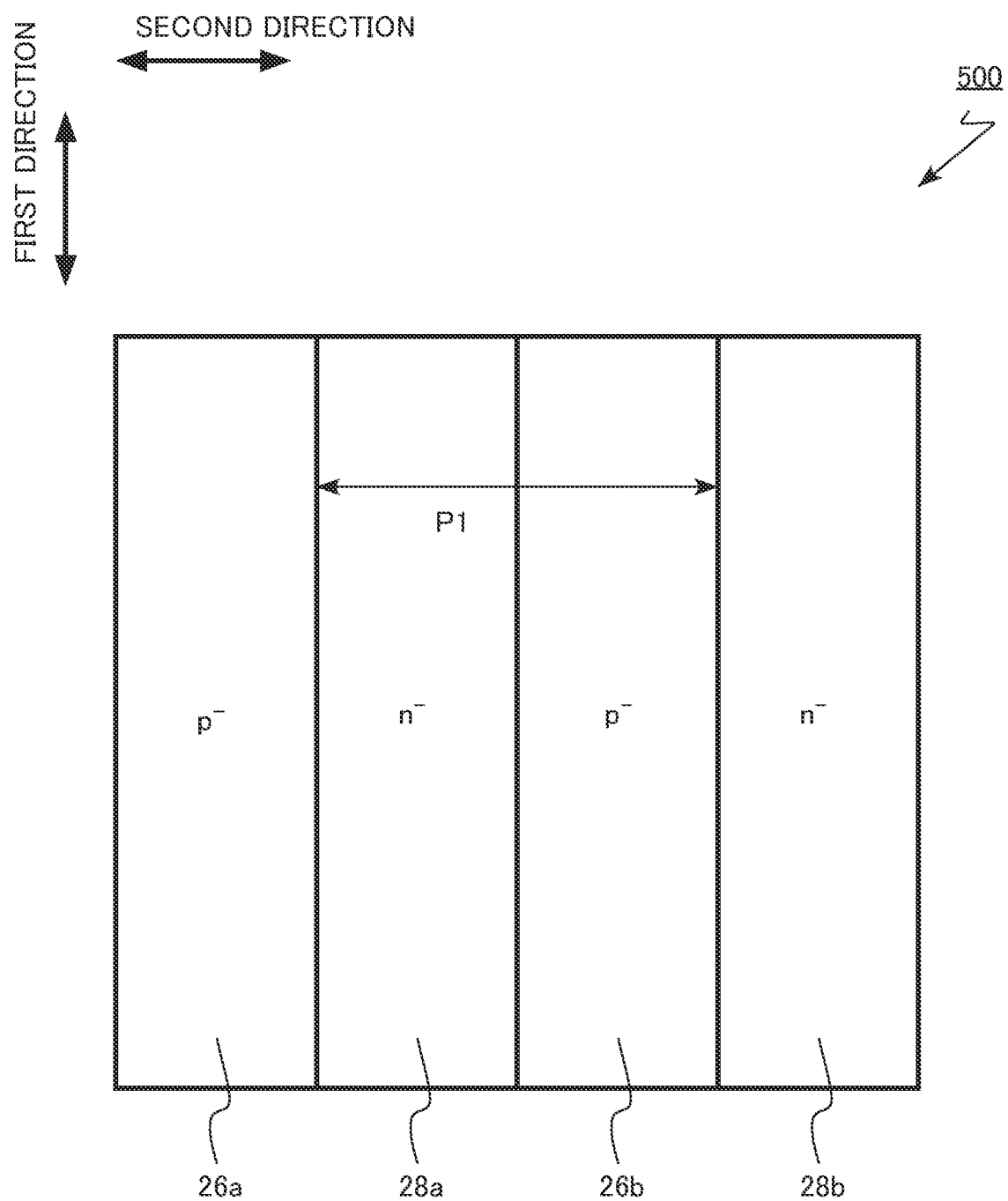
FIG. 22 is a schematic cross-sectional view of a semiconductor device of a fifth embodiment.

FIG. 22 is a schematic cross-sectional view of the semiconductor device of the fifth embodiment. FIG. 22 is a view corresponding to FIG. 20 of the fourth embodiment.

Figure 23:
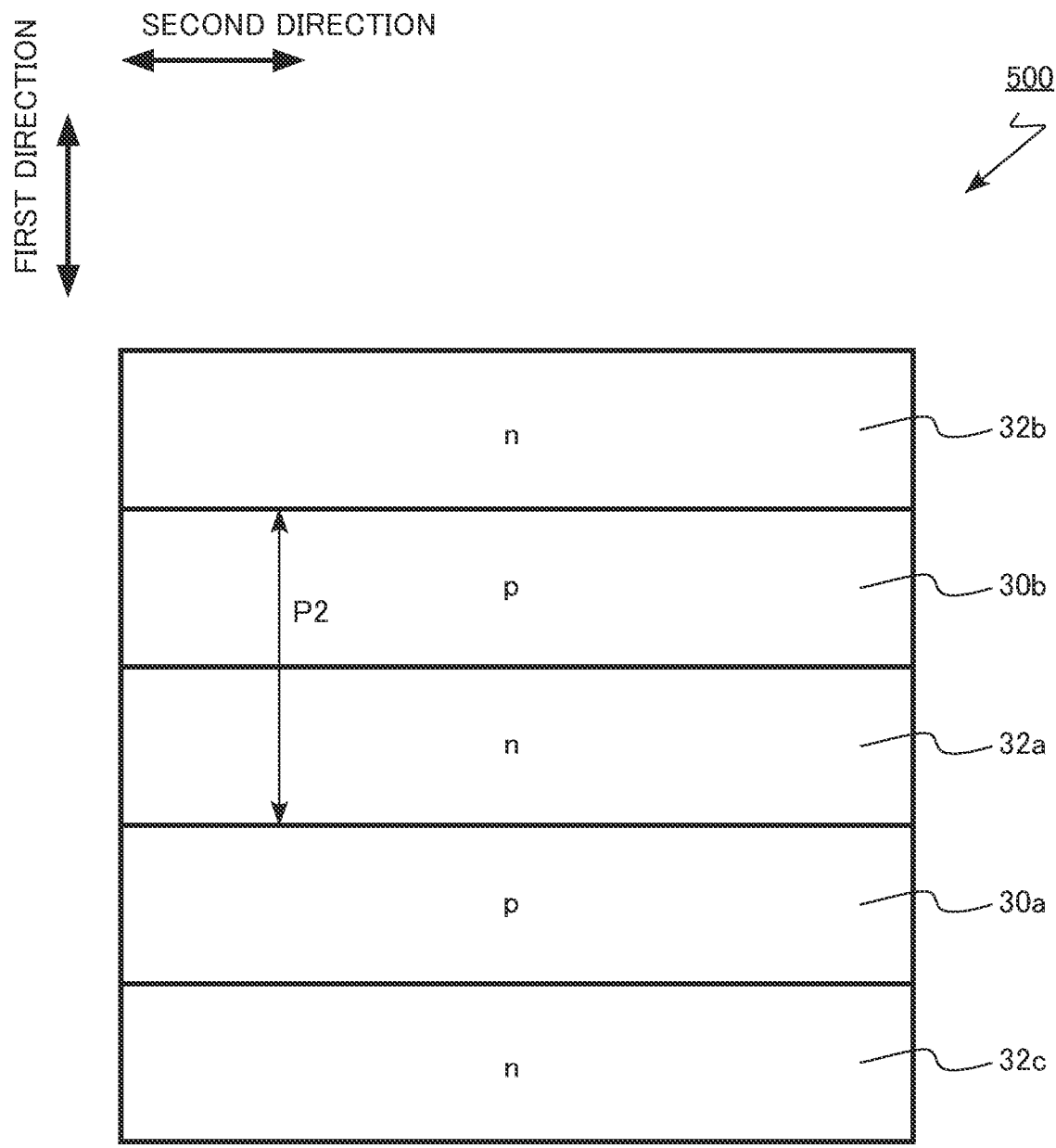
FIG. 23 is a schematic cross-sectional view of the semiconductor device of the fifth embodiment.

FIG. 23 is a schematic cross-sectional view of the semiconductor device of the fifth embodiment. FIG. 23 is a view corresponding to FIG. 21 of the fourth embodiment.

The semiconductor device of the fifth embodiment is a vertical MOSFET 500 of a trench gate type using silicon carbide.

A distance (P1 in FIG. 22) between a first p pillar region 26a and a second n pillar region 28b in the second direction is larger than a distance (P2 in FIG. 23) between a first p control region 30a and a second n control region 32b in the first direction. For example, the distance (P1 in FIG. 22) between a first p pillar region 26a and a second n pillar region 28b in the second direction is equal to or more than 1.5 times the distance (P2 in FIG. 23) between a first p control region 30a and a second n control region 32b in the first direction.

A repetition pitch (P1 in FIG. 22) of the p pillar region 26 and the n pillar region 28 in the second direction is larger than a repetition pitch (P2 in FIG. 23) of the p control region 30 and the n control region 32 in the first direction.

By increasing the repetition pitch of the SJ structure, in the MOSFET 500, for example, the SJ structure is easily formed in comparison to the MOSFET 400 of the fourth embodiment.

As described above, according to the fifth embodiment, a MOSFET capable of improving short circuit resistance can be realized.

As described above, in the first to fifth embodiments, the case of 4H-SiC is described as an example of the crystal structure of silicon carbide, but the present disclosure can also be applied to silicon carbides having other crystal structures such as 6H-SiC and 3C-SiC. In addition, it is also possible to apply a face other than the (0001) face to the surface of the silicon carbide layer 10.

In the first to fifth embodiments, the case where the first conductive type is a p-type and the second conductive type is an n-type is described as an example, but the first conductive type can be an n-type and the second conductive type can be a p-type.

In the first to fifth embodiments, aluminum (Al) is exemplified as the p-type impurities, but boron (B) can also be used. In addition, nitrogen (N) and phosphorous (P) are exemplified as the n-type impurities, but arsenic (As), antimony (Sb), and the like can also be applied.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer having a first face parallel to a first direction and a second direction orthogonal to the first direction, and a second face facing the first face;
a first trench provided on a side of the first face in the silicon carbide layer and extending in the first direction;
a second trench provided on the side of the first face in the silicon carbide layer, provided in the second direction with respect to the first trench, and extending in the first direction;
a first gate electrode provided in the first trench;
a second gate electrode provided in the second trench;
a first gate insulating layer provided between the first gate electrode and the silicon carbide layer;
a second gate insulating layer provided between the second gate electrode and the silicon carbide layer;
a first silicon carbide region of a first conductive type provided in the silicon carbide layer and extending in the second direction;
a second silicon carbide region of a second conductive type provided in the silicon carbide layer, extending in the second direction, and disposed in the first direction with respect to the first silicon carbide region;
a third silicon carbide region of a first conductive type provided in the silicon carbide layer, extending in the second direction, and disposed in the first direction with respect to the second silicon carbide region;
a fourth silicon carbide region of a second conductive type provided in the silicon carbide layer, extending in the second direction, and disposed in the first direction with respect to the third silicon carbide region;
a fifth silicon carbide region of a first conductive type provided in the silicon carbide layer, extending in the second direction, disposed between the first silicon carbide region and the first face, disposed in a third direction perpendicular to the first face with respect to the first silicon carbide region, disposed between the first trench and the second face and between the second trench and the second face, and having a first-conductivity type impurity concentration higher than a first-conductivity type impurity concentration in the first silicon carbide region, and;
a sixth silicon carbide region of a second conductive type provided in the silicon carbide layer, extending in the second direction, disposed between the second silicon carbide region and the first face, disposed in the third direction with respect to the second silicon carbide region, disposed between the first trench and the second face and between the second trench and the second face, and having a second-conductivity type impurity concentration higher than a second-conductivity type impurity concentration in the second silicon carbide region;
a seventh silicon carbide region of a first conductive type provided in the silicon carbide layer, extending in the second direction, disposed between the third silicon carbide region and the first face, disposed in the third direction with respect to the third silicon carbide region, disposed between the first trench and the second face and between the second trench and the second face, having a first-conductivity type impurity concentration higher than a first-conductivity type impurity concentration in the third silicon carbide region;
an eighth silicon carbide region of a second conductive type provided in the silicon carbide layer, extending in the second direction, disposed between the fourth silicon carbide region and the first face, disposed in the third direction with respect to the fourth silicon carbide region, disposed between the first trench and the second face and between the second trench and the second face, and having a second-conductivity type impurity concentration higher than a second-conductivity type impurity concentration in the fourth silicon carbide region;
a ninth silicon carbide region of a first conductive type provided in the silicon carbide layer, disposed between the fifth silicon carbide region and the first face, disposed between the sixth silicon carbide region and the first face, disposed between the seventh silicon carbide region and the first face, disposed between the eighth silicon carbide region and the first face, and disposed between the first trench and the second trench;
a tenth silicon carbide region of a second conductive type provided in the silicon carbide layer, disposed between the ninth silicon carbide region and the first face, and disposed between the first trench and the second trench;
an eleventh silicon carbide region of a first conductive type provided in the silicon carbide layer, disposed between the ninth silicon carbide region and the first face, disposed between the first trench and the second trench, and having a first-conductivity type impurity concentration higher than a first-conductivity type impurity concentration in the ninth silicon carbide region;

a first electrode provided on the side of the first face with respect to the silicon carbide layer and in contact with the tenth silicon carbide region and the eleventh silicon carbide region; and a second electrode provided on a side of the second face with respect to the silicon carbide layer.

2. The semiconductor device according to claim 1, wherein a distance between the fifth silicon carbide region and the seventh silicon carbide region in the first direction is smaller than a distance between the first silicon carbide region and the third silicon carbide region in the first direction.

3. The semiconductor device according to claim 1, wherein the eleventh silicon carbide region is disposed in the first direction with respect to the tenth silicon carbide region, the tenth silicon carbide region is disposed in the third direction with respect to the fifth silicon carbide region, and the eleventh silicon carbide region is disposed in the third direction with respect to the sixth silicon carbide region.

4. The semiconductor device according to claim 3, further comprising:

a twelfth silicon carbide region of a second conductive type provided in the silicon carbide layer, disposed between the ninth silicon carbide region and the first face, disposed between the first trench and the second trench, and disposed in the third direction with respect to the seventh silicon carbide region; and a thirteenth silicon carbide region of a first conductive type provided in the silicon carbide layer, disposed between the ninth silicon carbide region and the first face, disposed between the first trench and the second trench, and disposed in the third direction with respect to the eighth silicon carbide region.

5. The semiconductor device according to claim 4, further comprising a fourteenth silicon carbide region of a second conductive type provided in the silicon carbide layer, disposed between the ninth silicon carbide region and the first face, extending in the first direction, disposed between the first trench and the tenth silicon carbide region, disposed between the first trench and the eleventh silicon carbide region, disposed between the first trench and the twelfth silicon carbide region, disposed between the first trench and the thirteenth silicon carbide region, and having a second-conductivity type impurity concentration lower than a second-conductivity type impurity concentration in the tenth silicon carbide region.

6. The semiconductor device according to claim 1, wherein the first conductive type is a p-type, and the second conductive type is an n-type.

7. A semiconductor device comprising:

a silicon carbide layer having a first face parallel to a first direction and a second direction orthogonal to the first direction, and a second face facing the first face;

a first trench provided on a side of the first face in the silicon carbide layer and extending in the first direction;

a second trench provided on the side of the first face in the silicon carbide layer, provided in the second direction with respect to the first trench, and extending in the first direction;

a first gate electrode provided in the first trench;

a second gate electrode provided in the second trench;

a first gate insulating layer provided between the first gate electrode and the silicon carbide layer;

a second gate insulating layer provided between the second gate electrode and the silicon carbide layer;

a first silicon carbide region of a first conductive type provided in the silicon carbide layer and extending in the first direction;

a second silicon carbide region of a second conductive type provided in the silicon carbide layer, extending in the first direction, and disposed in the second direction with respect to the first silicon carbide region;

a third silicon carbide region of a first conductive type provided in the silicon carbide layer, extending in the first direction, and disposed in the second direction with respect to the second silicon carbide region;

a fourth silicon carbide region of a second conductive type provided in the silicon carbide layer, extending in the first direction, and disposed in the second direction with respect to the third silicon carbide region;

a fifth silicon carbide region of a first conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a first-conductivity type impurity concentration higher than a first-conductivity type impurity concentration in the first silicon carbide region;

a sixth silicon carbide region of a second conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a second-conductivity type impurity concentration higher than a second-conductivity type impurity concentration in the second silicon carbide region;

a seventh silicon carbide region of a first conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a first-conductivity type impurity concentration higher than the first-conductivity type impurity concentration in the first silicon carbide region;

an eighth silicon carbide region of a second conductive type provided in the silicon carbide layer, extending in the second direction, disposed between the first silicon carbide region and the first face, disposed between the second silicon carbide region and the first face, disposed between the third silicon carbide region and the first face, disposed between the fourth silicon carbide region and the first face, disposed between the first trench and the second face and between the second trench and the second face, and having a second-conductivity type impurity concentration higher than the second-conductivity type impurity concentration in the second silicon carbide region;

a ninth silicon carbide region of a first conductive type provided in the silicon carbide layer, disposed between the fifth silicon carbide region and the first face, between the sixth silicon carbide region and the first face, between the seventh silicon carbide region and the first face, between the eighth silicon carbide region and the first face, and disposed between the first trench and the second trench;

a tenth silicon carbide region of a second conductive type provided in the silicon carbide layer, disposed between the ninth silicon carbide region and the first face, and disposed between the first trench and the second trench;

an eleventh silicon carbide region of a first conductive type provided in the silicon carbide layer, disposed between the ninth silicon carbide region and the first face, disposed between the first trench and the second trench, and having a first-conductivity type impurity concentration higher than a first-conductivity type impurity concentration in the ninth silicon carbide region;

a first electrode provided on the side of the first face with respect to the silicon carbide layer and in contact with the tenth silicon carbide region and the eleventh silicon carbide region; and a second electrode provided on a side of the second face with respect to the silicon carbide layer.

8. The semiconductor device according to claim 7, wherein the eleventh silicon carbide region is disposed in the first direction with respect to the tenth silicon carbide region, the tenth silicon carbide region is disposed in a third direction perpendicular to the first face with respect to the fifth silicon carbide region, and the eleventh silicon carbide region is disposed in the third direction with respect to the sixth silicon carbide region.

9. The semiconductor device according to claim 7, wherein the first trench is disposed in a third direction perpendicular to the first face with respect to the first silicon carbide region, and the ninth silicon carbide region is disposed in the third direction with respect to the second silicon carbide region.

10. The semiconductor device according to claim 7, wherein a distance between the first silicon carbide region and the fourth silicon carbide region in the second direction is larger than a distance between the fifth silicon carbide region and the eighth silicon carbide region in the first direction.

* * * * *